United States Patent
Kurokawa et al.

(10) Patent No.: US 7,256,433 B2
(45) Date of Patent: Aug. 14, 2007

(54) BIPOLAR TRANSISTOR AND A METHOD OF MANUFACTURING THE SAME

(75) Inventors: Atsushi Kurokawa, Takasaki (JP); Masao Yamane, Takasaki (JP); Yoshinori Imamura, Tsukui (JP)

(73) Assignee: Renesas Technology Corp., Tokyo (JP)

( * ) Notice: Subject to any disclaimer, the term of this patent is extended or adjusted under 35 U.S.C. 154(b) by 163 days.

(21) Appl. No.: 10/833,142

(22) Filed: Apr. 28, 2004

(65) Prior Publication Data

US 2004/0212044 A1  Oct. 28, 2004

(30) Foreign Application Priority Data

Apr. 28, 2003  (JP) ............... 2003-123606

(51) Int. Cl.
*H01L 29/739* (2006.01)
(52) U.S. Cl. .............. 257/197; 257/571; 257/586; 257/623; 257/E21.387; 257/E29.044
(58) Field of Classification Search ........ 257/571, 257/586, 623, 197
See application file for complete search history.

(56) References Cited

U.S. PATENT DOCUMENTS

| 5,298,438 | A | * | 3/1994 | Hill ............... 438/353 |
| 5,434,091 | A | * | 7/1995 | Hill et al. ............. 438/315 |
| 5,445,976 | A | * | 8/1995 | Henderson et al. ......... 438/319 |
| 5,702,958 | A | * | 12/1997 | Liu et al. ............. 438/309 |
| 6,165,859 | A | * | 12/2000 | Hamm et al. ........... 438/312 |
| 6,495,869 | B2 | * | 12/2002 | Blayac et al. ........... 257/197 |
| 6,528,378 | B2 | * | 3/2003 | Hirata et al. ............ 438/317 |
| 6,593,604 | B2 | * | 7/2003 | Ishimaru ............. 257/197 |

FOREIGN PATENT DOCUMENTS

JP  2001-230261  8/2001

* cited by examiner

*Primary Examiner*—Jerome Jackson
*Assistant Examiner*—José R. Díaz
(74) *Attorney, Agent, or Firm*—Antonelli, Terry, Stout & Kraus, LLP.

(57) ABSTRACT

A bipolar transistor having enhanced characteristics is fabricated by etching a base mesa, which is formed below an emitter mesa (upper emitter layer) and a base electrode, so as to have jut regions on the edges of its generally rectangular region. A mask film, e.g., insulating film, is formed to cover the rectangular region and jut regions, and the base layer is etched by use of the insulating film as a mask to form a base mesa. Consequently, abnormal etching can be prevented from occurring along the base electrode and emitter mesa on the edges of the area where the base electrode and emitter mesa confront each other, and an increase in resistance between the base layer and the emitter layer can be prevented, whereby the bipolar transistor can have enhanced characteristics.

15 Claims, 22 Drawing Sheets

BIPOLAR TRANSISTOR AND A METHOD OF MANUFACTURING THE SAME

CROSS-REFERENCE TO RELATED APPLICATION

The present application claims priority from Japanese patent application JP 2003-123606 filed on Apr. 28, 2003, the content of which is hereby incorporated by reference into this application.

BACKGROUND OF THE INVENTION

The present invention relates to a bipolar transistor (semiconductor device), and, more particularly, to a technique which is applicable effectively to a bipolar transistor having mesa-type semiconductor layers.

Studies are under way on bipolar transistors having a collector layer, a base layer and an emitter layer formed in this order in a transistor region on a semiconductor substrate, with remaining areas being etched off. These bipolar transistors, which have a collector, base and emitter layers of a trapezoidal cross section (shape of a "mesa"), are called mesa-type bipolar transistors.

Also studies are under way on bipolar transistors formed of a compound semiconductor of the III-V groups, such as gallium-arsenic (GaAs). Such a compound semiconductor is characterized by having a higher mobility as compared with Si (silicon) and by enabling the formation of semi-insulating crystal and mixed crystal to create hetero junctions.

For example, a hetero-junction bipolar transistor (HBT: Hetero-junction Bipolar Transistor) based on the use of gallium-arsenic is a bipolar transistor which is formed of GaAs for the base layer and which has a different semiconductor, such as InGaP (indium-gallium-phosphor), for the emitter layer. Using the hetero junction (different junction) to make the emitter forbidden band width of base-emitter junction larger than that of the base can improve the transistor characteristics, such as providing a larger current gain.

Patent document 1 discloses a hetero-junction bipolar transistor having a reduced base-emitter capacitance. The base electrode (1) and emitter electrode (2) of this transistor have rectangular patterns, and they are formed over a rectangular base layer (5).

[Patent document 1]
Japanese Patent Application Laid-Open No.2001-230261 (FIG. 1 and FIG. 2)

SUMMARY OF THE INVENTION

The inventors of the present invention have been studying HBTs which are based on the use of GaAs. For example, an n-type GaAs (collector layer), p-type GaAs (base layer), and n-type InGaP (emitter layer) are formed in this order on a semiconductor substrate, and areas other than the transistor region are etched off to separate individual transistors.

In order for a HBT-based power amplifier (amplifying circuit) to have an improved performance, specifically, an enhanced current appending efficiency and current gain, it is necessary to reduce the base-collector capacitance per unit emitter area. Namely, it is necessary to reduce the emitter-base junction area (Jeb) to base-collector junction area (Jbc) ratio. For attaining such a smaller ratio, it is desirable to make the base mesa as small as possible relative to the emitter mesa, as will be explained in detail later (refer to FIG. 13).

The base mesa is overlaid by the base electrode and emitter mesa. In regard to the order of formation, the base electrode and emitter mesa are formed first, and, thereafter, the base layer below them is etched to form the base mesa. Accordingly, by forming the base mesa along the edges of the composite planar pattern of the base electrode and emitter mesa, the base mesa can be made smaller. In other words, the base-collector capacitance can be reduced by making the base mesa have virtually the same shape as the composite planar pattern.

Specifically, a film for masking, such as an insulating film, is formed over the composite planar pattern, and the base layer is etched by use of the mask film to form a base mesa. At this time, etching liquid soaks along the edge of the base electrode, resulting in excessive etching of the base layer. Similar excessive etching occurs along the emitter mesa. This excessive etching will be explained in more detail with reference to FIG. 15 through FIG. 19.

The occurrence of excessive etching increases the resistance between the base layer and the emitter layer, causing the base-emitter current (Ibe) to decrease. As a result, the bipolar transistor has degraded characteristics, such as a lower rating of collector current (Ic).

It is an object of the present invention to provide a technique for improving the characteristics of bipolar transistors.

These and other objects and novel features of the present invention will become apparent from the following description and the attached drawings.

Among the aspects of the present invention disclosed in this specification, representatives ones are described as follows.

The bipolar transistor in accordance with the present invention has a collector, a base and an emitter, and it comprises: (a) a base mesa which consists of the base formed over the collector, having first through fourth base mesa sides and extending in the directions in which the first and the third base mesa sides meet, the third and the second base mesa sides meet, the second and the fourth base mesa sides meet, and the fourth and the first base mesa sides meet; (b) an emitter mesa which consists of the emitter formed over the base mesa, having first through fourth emitter mesa sides and extending in the directions in which the first and the third emitter mesa sides meet, the third and the second emitter mesa sides meet, the second and the fourth emitter mesa sides meet, and the fourth and the first emitter mesa sides meet; and (c) a base electrode which is formed over the base mesa so as to have first through fourth base electrode sides and to extend in the directions in which the first and the third base electrode sides meet, the third and the second base electrode sides meet, the second and the fourth base electrode sides meet, and the fourth and the first base electrode sides meet, wherein (d1) the second emitter mesa side confronts the first base electrode side, (d2) the second base mesa side runs along the second base electrode side, (d3) the fourth base mesa side extends in the direction in which the second emitter mesa side, first base electrode side, second base mesa side and second base electrode side meet, and (d4) a second distance between the first base electrode side, at its end immediate to the fourth base mesa side, and the fourth base mesa side is larger than a first distance between the second base mesa side and the second base electrode side.

The second emitter mesa side corresponds to a side parallel to EML2, for example, the first base electrode side corresponds to a side parallel to BEL1, for example, the second base mesa side corresponds to a side parallel to BML2, for example, the second base electrode side corresponds to a side parallel to BEL2, for example, and the fourth base mesa side corresponds to a side parallel to BML4 of a jut region. The first distance corresponds to Lb2, for example, and the second distance corresponds to LbFa, for example.

The bipolar transistor according to the present invention has a collector, a base and an emitter, and it includes: (a) a base mesa which consists of the base formed over the collector, having first through fourth base mesa sides and extending in the directions in which the first and the third base mesa sides meet, the third and the second base mesa sides meet, the second and the fourth base mesa sides meet, and the fourth and the first base mesa sides meet; (b) an emitter mesa which consists of the emitter formed over the base mesa, having a first through fourth emitter mesa sides and extending in the directions in which the first and the third emitter mesa sides meet, the third and the second emitter mesa sides meet, the second and the fourth emitter mesa sides meet, and the fourth and the first emitter mesa sides meet; and (c) a base electrode which is formed over the base mesa so as to have first through fourth base electrode sides and to extend in the directions in which the first and the third base electrode sides meet, the third and the second base electrode sides meet, the second and the fourth base electrode sides meet, and the fourth and the first base electrode sides meet, wherein (d1) the second emitter mesa side confronts the first base electrode side, (d2) the first base mesa side runs along the first emitter mesa side, (d3) the fourth base mesa side extends in the direction in which the second emitter mesa side, first base electrode side, first base mesa side and first emitter mesa side meet, and (d4) a second distance between the second emitter mesa side, at its end immediate to the fourth base mesa side, and the fourth base mesa side is larger than a first distance between the first base mesa side and the first emitter mesa side.

The second emitter mesa side corresponds to a side parallel to EML2, for example, the first base electrode side corresponds to a side parallel to BEL1, for example, the first base mesa side corresponds to a side parallel to BML1, the first emitter mesa side corresponds to a side parallel to EML1, for example, and the fourth base mesa side corresponds to a side parallel to BML4 of a jut region, for example. The first distance corresponds to Le1, for example, and the second distance corresponds to LeFa, for example.

The inventive bipolar transistor may be manufactured by a method which comprises, the steps of: (a) in a first region having the first through fourth sides and extending in the directions in which the first and the third sides meet, the third and the second sides meet, the second and the fourth sides meet, and the fourth and the first sides meet, (a1) forming an emitter mesa which constitutes the emitter, has first through fourth emitter mesa sides, and extends in the directions in which the first and the third emitter mesa sides meet, the third and the second emitter mesa sides meet, the second and the fourth emitter mesa sides meet, and the fourth and the first emitter mesa sides meet, (a2) forming a base electrode which has the first through fourth base electrode sides, and extends in the directions in which the first and the third base electrode sides meet, the third and the second base electrode sides meet, the second and the fourth base electrode sides meet, and the fourth and the first base electrode sides meet, wherein: (a3) the second emitter mesa side confronts the first base electrode side, (a4) the second side runs along the second base electrode side, (a5) the fourth side extends in the direction in which the second emitter mesa side, the first base electrode side, the second side and the second base electrode side meet; (b) forming a mask film in the first region over the emitter mesa and the base electrode and in a jut region which is formed contiguously to the first region, wherein (b1) the jut region is formed in the first region, in its portion immediate to the fourth side, such that a second distance between the first base electrode side, at its end immediate to the fourth side, or at the intersection of the first base electrode side and the fourth side, in case these sides intersect, and the edge of the jut region is larger than a first distance between the second base electrode side and the second side; (c) forming a base mesa, which constitutes the base, by etching the emitter mesa and the semiconductor layer below the base electrode by use of the mask film for masking; and (d) forming the collector in the layer below the base mesa.

The second emitter mesa side corresponds to a side parallel to EML2, for example, the first base electrode side corresponds to a side parallel to BEL1, for example, the second base mesa side corresponds to a side parallel to BML2, for example, the second base electrode side corresponds to a side parallel to BEL2, for example, and the fourth base mesa side corresponds to a side parallel to BML4 of the jut region. The first distance corresponds to Lb2, for example, and the second distance corresponds to LbFa, for example.

The inventive bipolar transistor may also be manufactured by a method which comprises the steps of: (a) in a first region having first through fourth sides and extending in the directions in which the first and the third sides meet, the third and the second sides meet, the second and the fourth sides meet, and the fourth and the first sides meet, (a1) forming an emitter mesa which constitutes the emitter, has first through fourth emitter mesa sides, and extends in the directions in which the first and the third emitter mesa sides meet, the third and the second emitter mesa sides meet, the second and the fourth emitter mesa sides meet, and the fourth and the first emitter mesa sides meet, (a2) forming a base electrode which has first through fourth base electrode sides, and extends in the directions in which the first and the third base electrode sides meet, the third and the second base electrode sides meet, the second and the fourth base electrode sides meet, and the fourth and the first base electrode sides meet, wherein: (a3) the second emitter mesa side confronts the first base electrode side, (a4) the first side runs along the first emitter mesa side, (a5) the fourth side extends in the direction in which the second emitter mesa side, the first base electrode side, the first side and the first emitter mesa side meet; (b) forming a mask film in the first region over the emitter mesa and the base electrode and in a jut region which is formed contiguously to the first region, wherein (b1) the jut region is formed in the first region, in its portion immediate to the fourth side, such that a second distance between the second emitter mesa side, at its end immediate to the fourth side, or at the intersection of the second emitter mesa side and the fourth side, in case these sides intersect, and the edge of the jut region is larger than a first distance between the first emitter mesa side and the first side; (c) forming a base mesa, which constitutes the base, by etching the emitter mesa and the semiconductor layer below the base electrode by use of the mask film for masking; and (d) forming the collector in the layer below the base mesa.

The second emitter mesa side corresponds to a side parallel to EML2, for example, the first base electrode side corresponds to a side parallel to BEL1, for example, the first base mesa side corresponds to a side parallel to BML1, the first emitter mesa side corresponds to a side parallel to EML1, for example, and the fourth base mesa side corresponds to a side parallel to BML4 of the jut region. The first distance corresponds to Le1, for example, and the second distance corresponds to LeFa, for example.

DESCRIPTION OF THE PREFERRED EMBODIMENTS

Embodiments of this invention will be explained with reference to the drawings. Throughout the figures, items having the same functions are referred to by common symbols, and an explanation thereof is not repeated.

Embodiment 1

The structure and method of fabrication of a semiconductor device (HBT) based on a first embodiment will be explained. FIG. 1 through FIG. 11 show, by cross-sectional view and plan view the substrate, the semiconductor device of this embodiment.

First, the features of this semiconductor device (HBT) in regard to the structure will be explained, while the detailed structure will be clarified in a later explanation based on the fabrication method.

Figure 4:
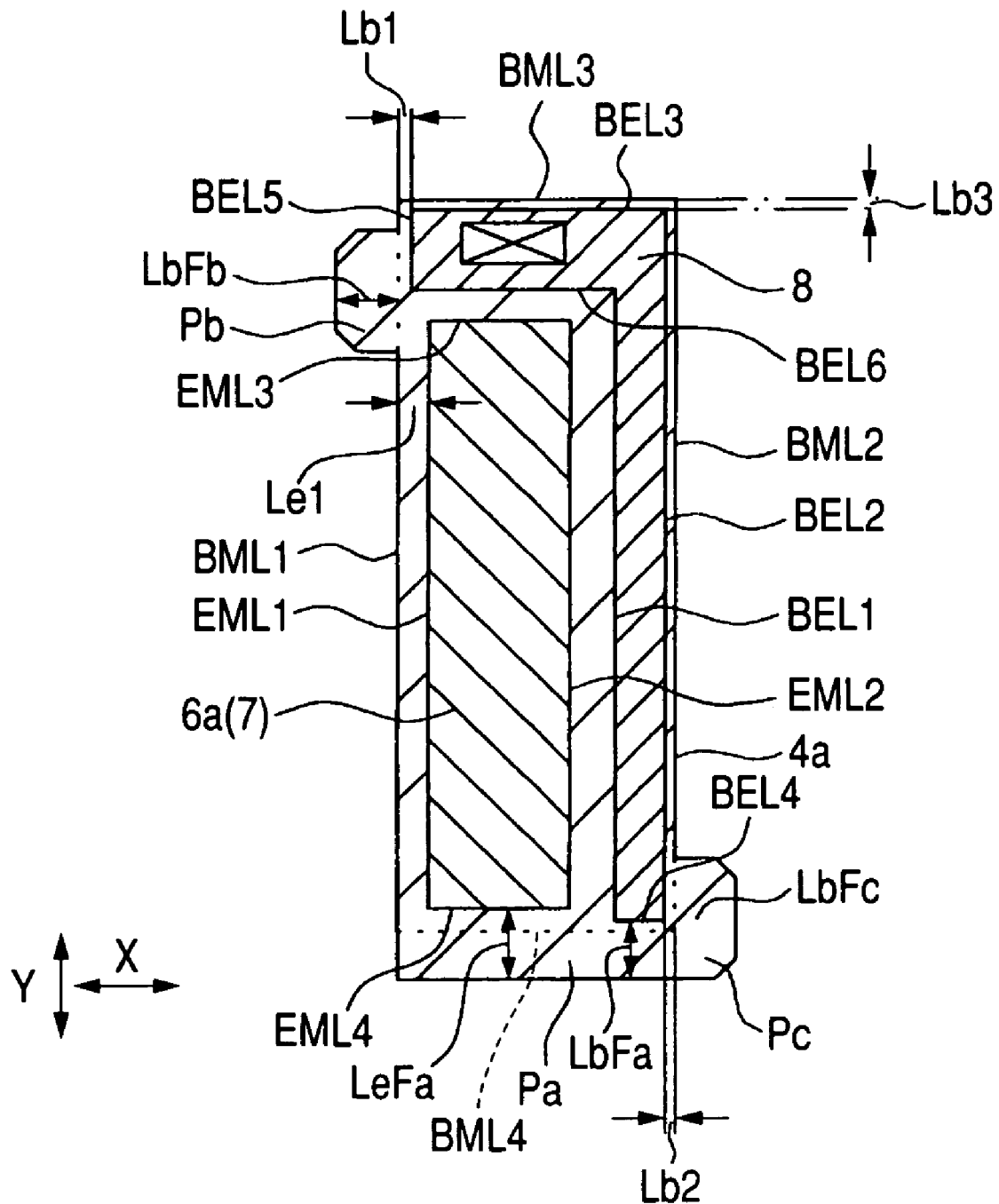
FIG. 4 is a plan view of the principal portion of the substrate, showing the semiconductor device (HBT) fabrication method of the first embodiment.
Figure 6:
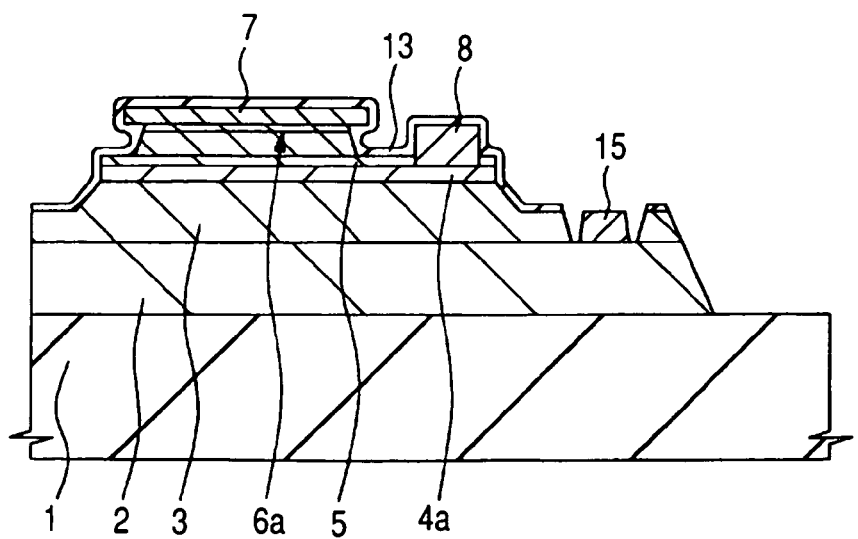
FIG. 6 is a cross-sectional view taken along line A-A in FIG. 7.
Figure 7:
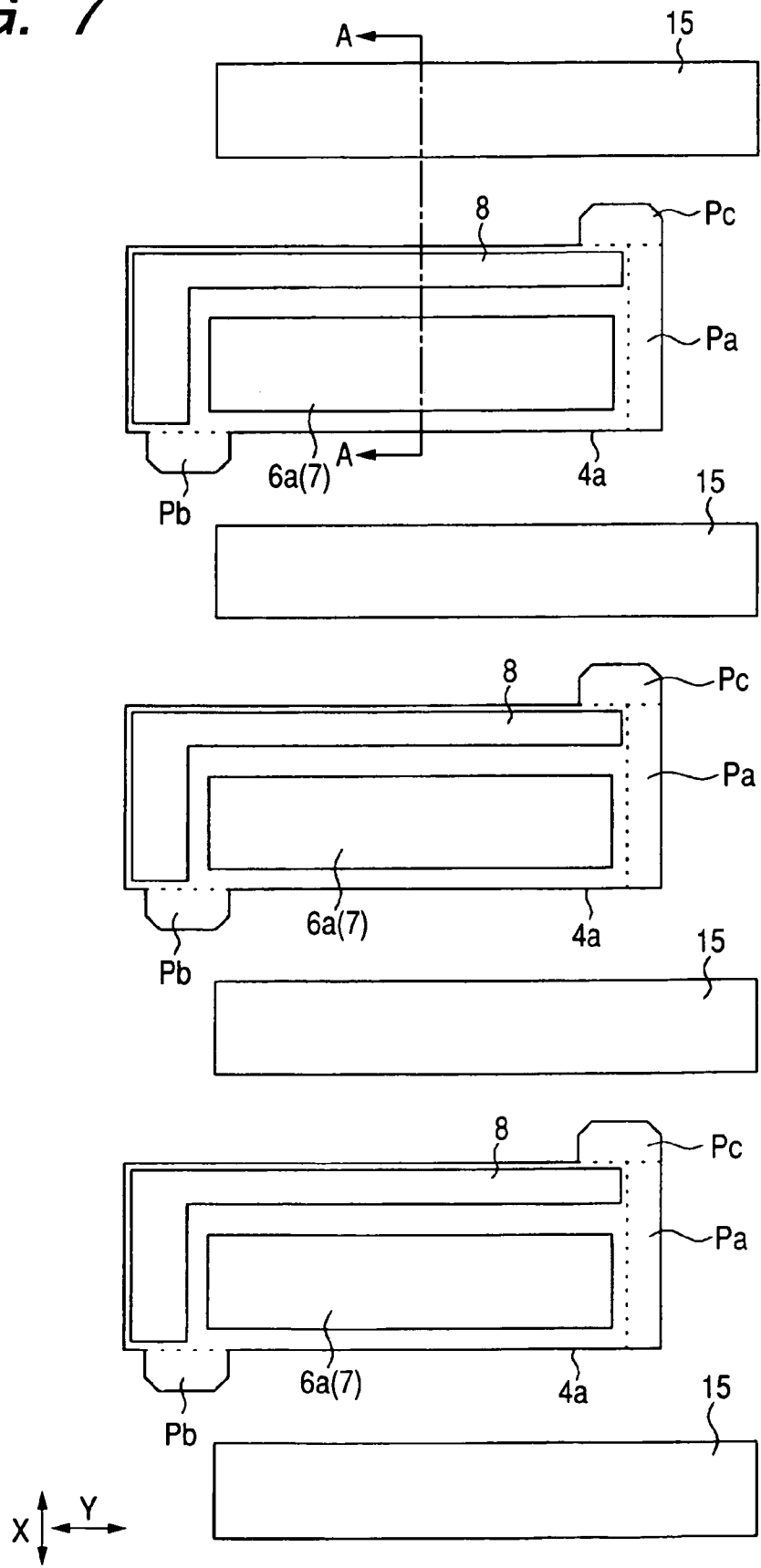
FIG. 7 is a plan view of the principal portion of the substrate, showing the semiconductor device (HBT) fabrication method of the first embodiment.
Figure 8:
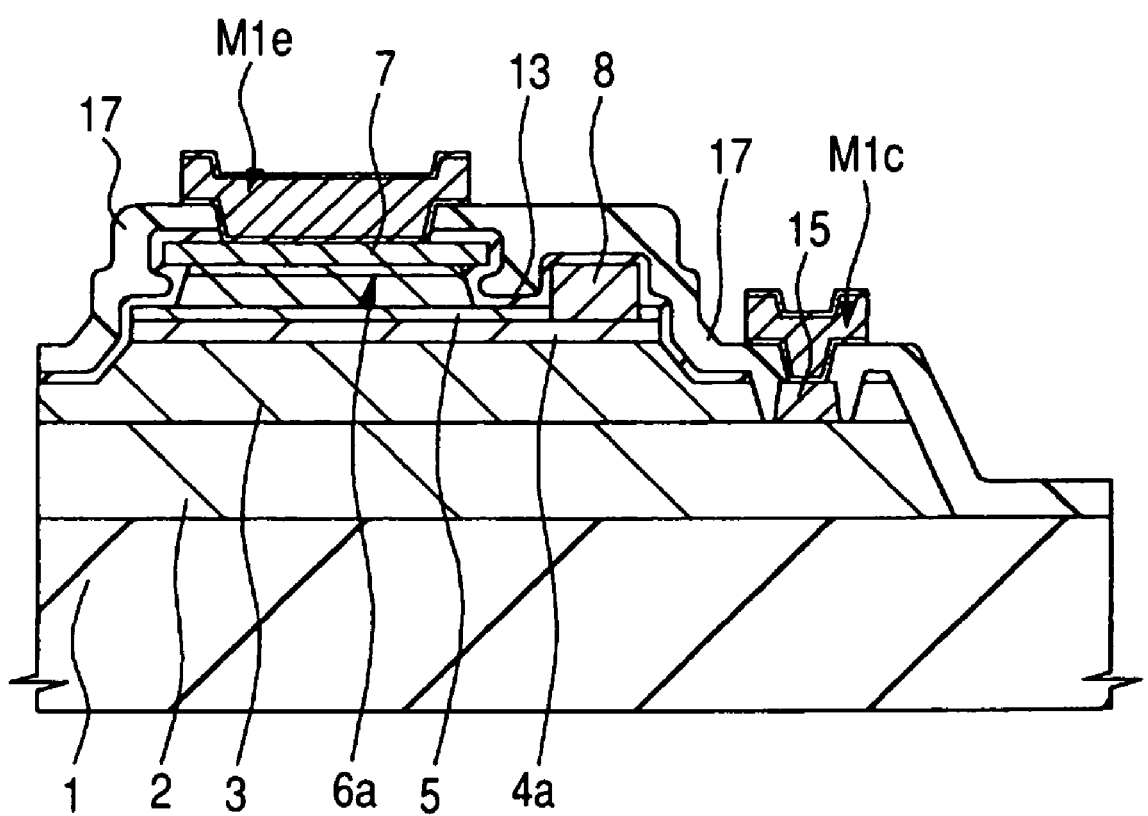
FIG. 8 is a cross-sectional view taken along line A-A in FIG. 9.

The semiconductor device (HBT) of this embodiment has a base mesa 4a made from a p-type GaAs layer, as shown in FIG. 4, FIG. 6 and FIG. 7. An n-type InGaP layer (emitter layer) 5 is formed over the base mesa 4a, and an n-type GaAs layer (collector layer) 3 is formed under the base mesa 4a. The base mesa 4a, which is formed of a p-type GaAs layer, may be conceived to include the upper portion (trapezoidal section) of the n-type GaAs layer 3 below it.

An emitter mesa (upper emitter layer) 6a having a generally rectangular shape and an L-shaped base electrode 8 are formed over the base mesa 4a, as shown in FIG. 7. An emitter electrode 7 is formed on the emitter mesa 6a. Collector electrodes 15 are formed on both sides of the base mesa 4a, and these electrodes 15 are connected electrically through the n-type GaAs layer (collector layer) 3 and an n$^+$-type GaAs layer (sub-collector layer) 2.

The base mesa 4a has a generally rectangular shape, and it includes jut regions Pa, Pb and Pc which jut out of the rectangular region, as shown in FIG. 4. The rectangular region is a composite planar pattern of the base electrode 8 and emitter mesa 6a.

The jut regions (Pa and Pb) are located on the edges of areas where the base electrode 8 and the emitter mesa 6a confront each other (refer to the hatched portion of FIG. 20), i.e., on the edges of areas defined by the sides EML3 and EML2 of the emitter mesa 6a and the sides BEL6 and BEL1 of the base electrode 8. In other words, the jut regions are located in the sections of short distances between the ends of the four sides and the sides of the composite planar pattern (dotted line in FIG. 20) so as to increase the distance between the ends and the edges of the base mesa. In other words, the jut regions Pa and Pb are formed in the directions of extension (y direction and x direction, respectively) of the base electrode 8. The jut region Pa is formed in the direction of extension (y direction) of the emitter mesa 6a. The area where the base electrode 8 and the emitter mesa 6a confront each other is indicated by BE when necessary.

The base electrode 8, emitter electrode 7 and collector electrode 15 are led out through first-layer and second-layer wiring lines.

Next, the semiconductor device (HBT) of this embodiment will be explained by means of the following the fabrication steps.

Figure 1:
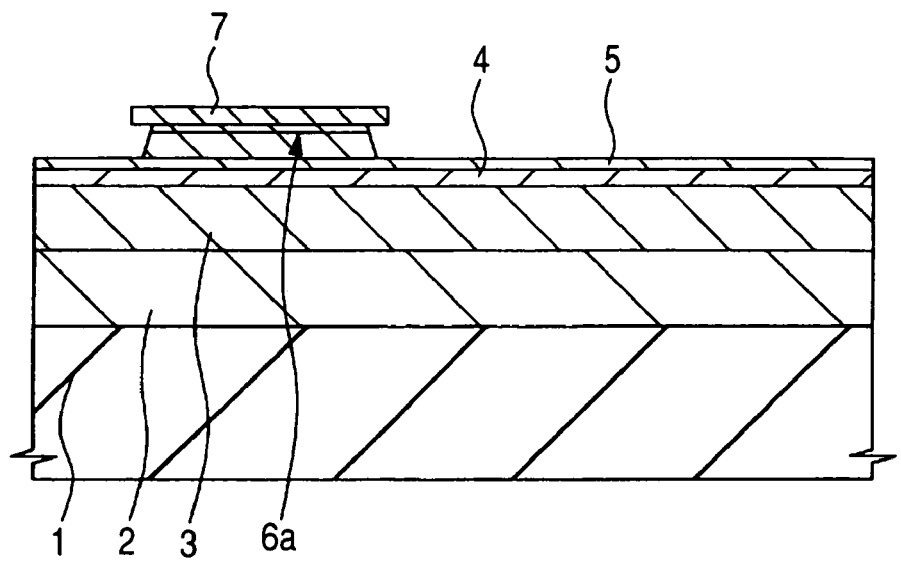
FIG. 1 is a cross-sectional view of the principal portion of a substrate, showing the semiconductor device (HBT) fabrication method based on a first embodiment of this invention.

On a semi-insulating GaAs substrate 1 which is 600 μm in thickness (will be termed simply "substrate" hereinafter), an $n^+$-type GaAs layer (sub-collector layer) 2 is formed to have a thickness of about 700 nm, based on the metal organic chemical vapor deposition (MOCVD) process, as shown in FIG. 1. Next, an n-type GaAs layer (collector layer) 3 of about 700 nm in thickness and a p-type GaAs layer (base layer) 4 of about 100 nm in thickness are formed in this order on the sub-collector layer 2 based on the MOCVD process.

Next, an n-type InGaP layer (emitter layer) 5 is deposited to a thickness of about 35 nm based on the MOCVD process, and an upper emitter layer is formed to thereon a 400-nm thickness. The upper emitter layer is a laminated layer consisting of an n-type GaAs layer and an n-type InGaAs layer disposed thereon, and it will be etched to become the emitter mesa 6a, as will be explained later. The n-type InGaAs layer in the upper emitter layer is used to make ohmic contact with the emitter electrode 7, as will be explained later.

In this manner, different semiconductor stuffs (hetero junction) are used for the base layer (p-type GaAs layer) 4 and the emitter layer (n-type InGaP layer) 5.

Next, a conductive film, e.g., a tungsten silicide (WSi) film, is deposited to a thickness of about 300 nm based on a sputtering process, for example. Next, the WSi film is treated by a photolithographic process and dry etching process to become the emitter electrode 7.

Next, the upper emitter layer is treated by wet etching by use of the emitter electrode 7 as a mask, thereby to form the emitter mesa 6a. The n-type InGaP (emitter layer) 5 is exposed by this etching process. Alternatively, the n-type InGaP layer (emitter layer) 5 may be etched to expose the p-type GaAs layer (base layer) 4. Due to the side etching of this process, the planar pattern of the emitter mesa 6a becomes smaller by about 0.3-0.7 μm from the edges of the emitter electrode 7. The emitter electrode 7 may be depicted in the same fashion as the emitter mesa 6a in some plan views expediently.

Figure 2:
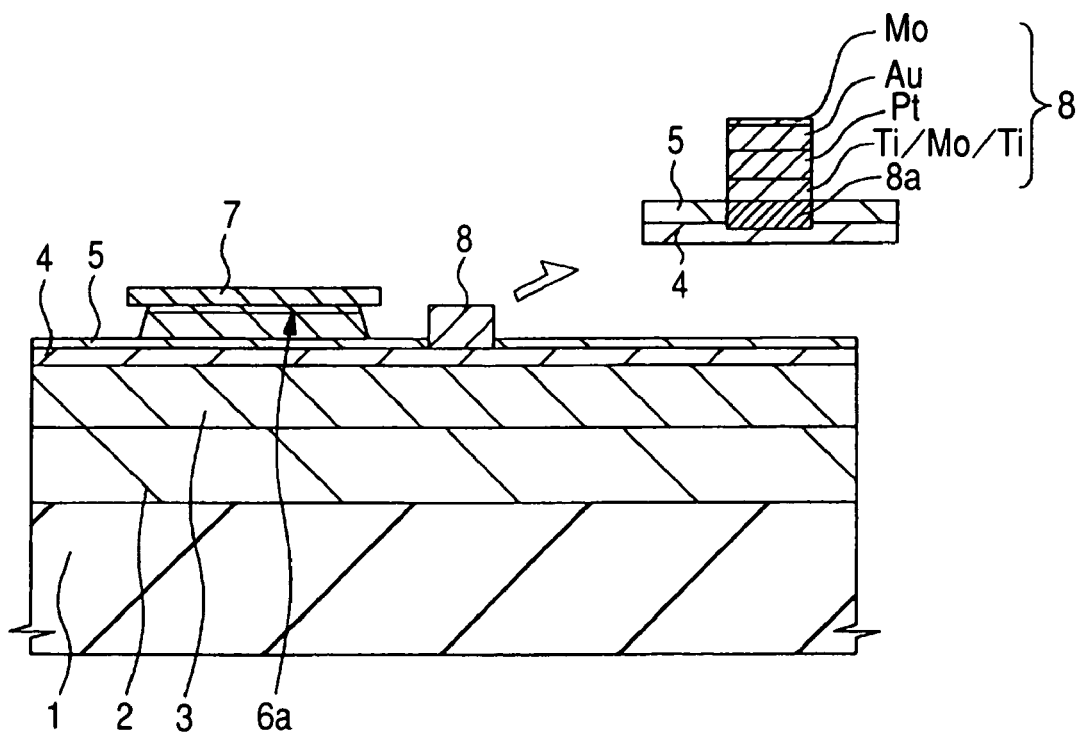
FIG. 2 is a cross-sectional view of the principal portion of a substrate, showing the semiconductor device (HBT) fabrication method based on the first embodiment of this invention.

Next, layers of platinum (Pt), titanium (Ti)/molybdenum (Mo)/Ti, Pt, gold (Au) and Mo are laminated in this order from the bottom to form the base electrode 8, as shown in FIG. 2. The Ti/Mo/Ti layers are 10/20/50 nm in thickness, the Pt layer is 50 nm, the Au layer is 100 nm, and the uppermost Mo layer is 10 nm, for example. The lowermost Pt layer reacts with the n-type InGaP layer (emitter layer) 5 and the p-type GaAs layer (base layer) 4 below it to become a reactive section (alloy section) 8a of about 40 nm. The base electrode 8 can be formed by the lift-off process, for example.

Specifically, a photoresist film (will be termed simply "resist film" hereinafter) is formed on the surface, excluding the area for the formation of the base electrode 8; the above-mentioned laminated film is formed over the entire surface; and the resist overlaid by the laminated film is removed so that a pattern of laminated film is left in the area.

In this case, the resist film is made to overhang the area of base electrode 8 so that the laminated film is not formed on the side wall of resist film. Consequently, the laminated film separates the resist film into an area for the base electrode 8 and another area. In addition, etching liquid soaks from the exposed portion of the resist film, enabling the laminated film to remain only in the intended area.

Alternatively, the base electrode 8 may be formed through the formation of a laminated film by the sputtering process or CVD (chemical vapor deposition) process and a subsequent etching process. A metal such as Au is limited in the selection of an etching gas or liquid in the case of chemical etching, and it is also difficult to achieve a etching selectivity relative to the lower layer in the case of physical etching. Therefore, in case the laminated film includes Au, it is preferable to form a pattern of the film by the lift-off process.

After that, the semiconductor stuff is treated by the annealing process (alloy process) so that the lower Pt layer of the base electrode 8 reacts with the n-type InGaP layer (emitter layer) 5 and p-type GaAs layer (base layer) 4. The resulting reactive section 8a enables the base electrode 8 to have ohmic contact with the p-type GaAs layer (base layer) 4. In the top-right section of FIG. 2, an enlarged cross-sectional view of the base electrode 8 is shown.

Figure 3:
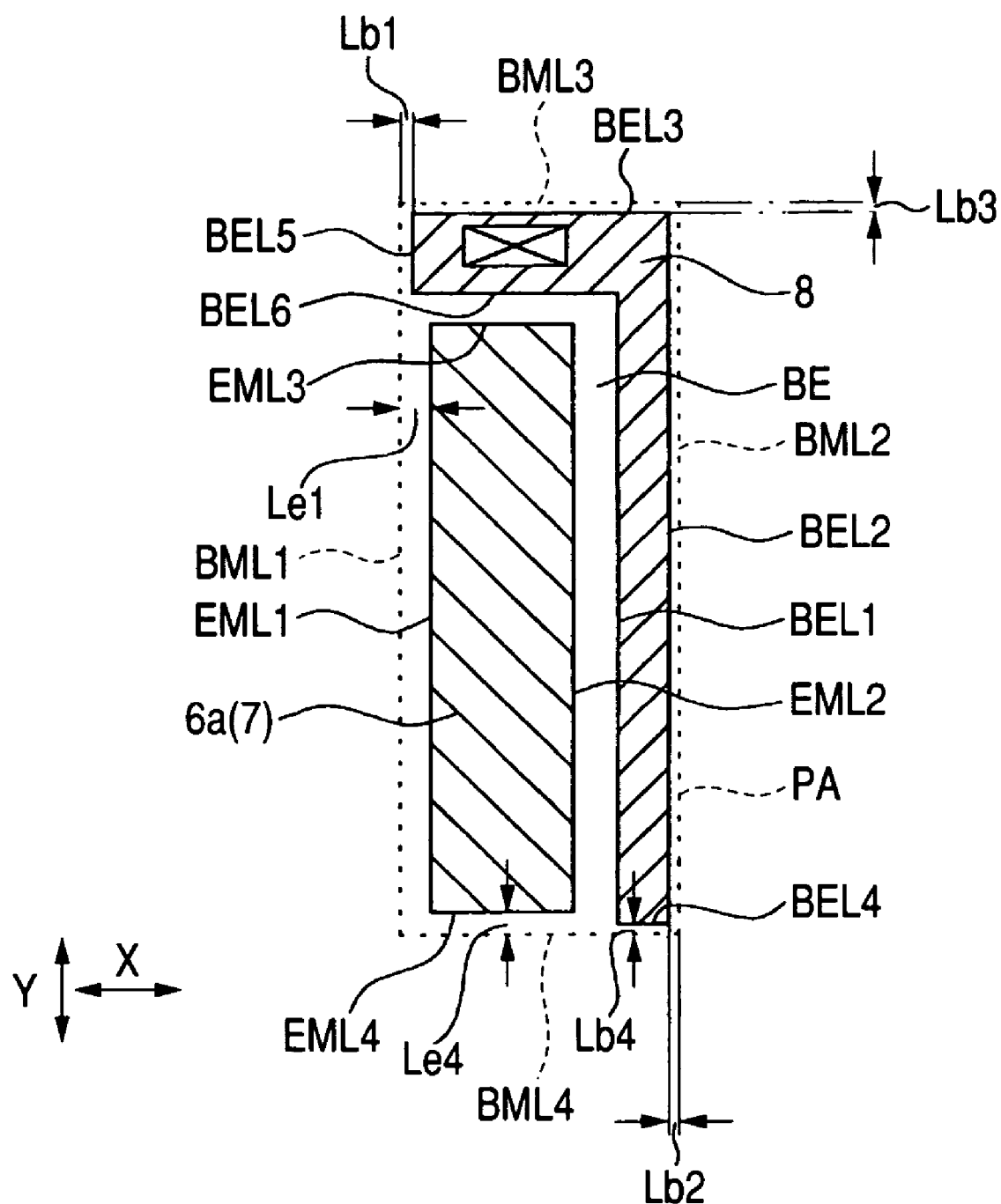
FIG. 3 is a plan view of the principal portion of the substrate, showing the semiconductor device (HBT) fabrication method of the first embodiment.

FIG. 3 shows in a plan view the principal portion of the substrate, with the base electrode 8 being formed thereon. The emitter mesa 6a (emitter electrode 7) is rectangular as seen in planar pattern, and it has sides EML1 and EML2 extending in the y direction and sides EML3 and EML4 extending in the x direction.

The base electrode 8 is L-shaped, and it consists of a first section which is parallel to the side EML2 of emitter mesa 6a and a second section which is parallel to the side EML3 of emitter mesa 6a. The first section is bounded by the sides BEL1, BEL2 and BEL4, and the second section is bounded by the sides BEL6, BEL3 and BEL5. The second section has a connection section for a base lead line (M1b).

Figure 20:
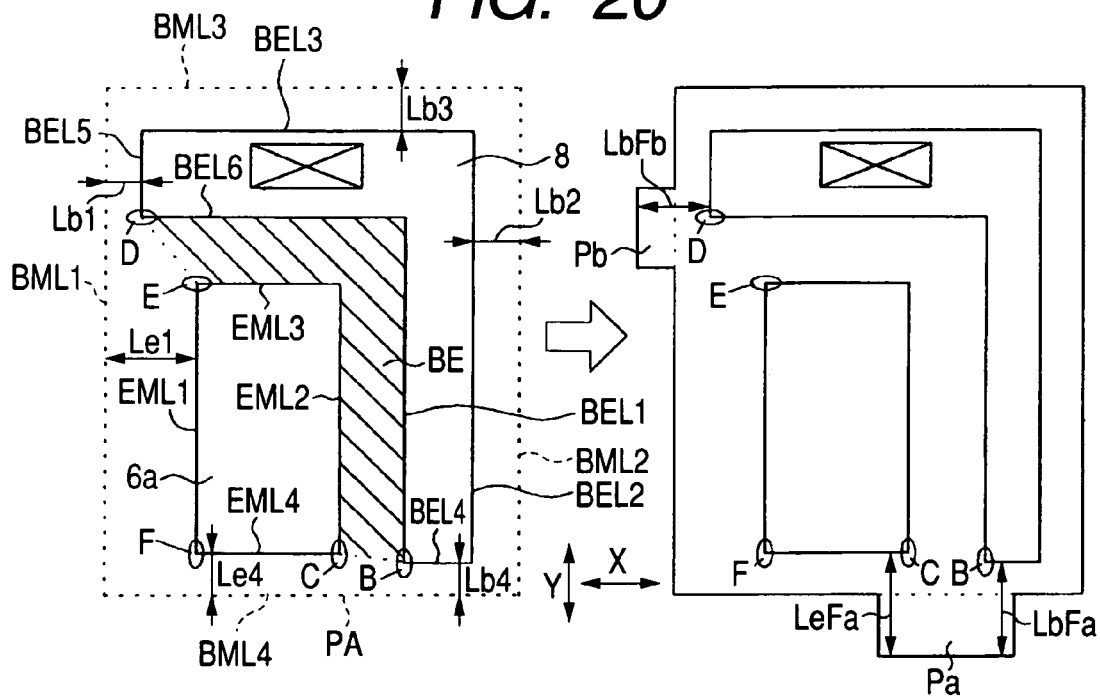
FIG. 20 is a plan view of the principal portion of the substrate, illustrating the shape of base mesa of the semiconductor device (HBT) based on the first embodiment.

The base-emitter current (Ibe) flows from the base electrode 8 to the emitter mesa 6a (emitter electrode 7) through the area BE where the emitter mesa 6a and the base electrode 8 confront each other (refer to the hatched portion of FIG. 20). The area BE is defined by the sides EML3 and EML2 of the emitter mesa and the sides BEL6 and BEL1 of the base electrode 8.

Figure 21:
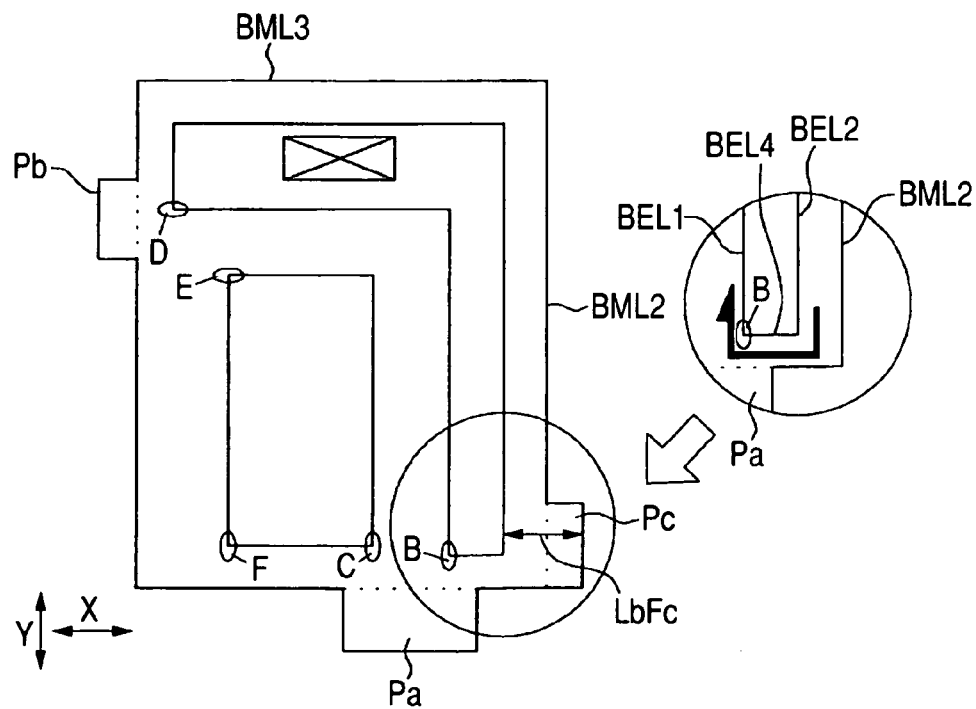
FIG. 21 is a plan view of the principal portion of the substrate, illustrating the shape of base mesa of the semiconductor device (HBT) based on the first embodiment.

Subsequently, the emitter mesa 6a and the base layer 4 below the base electrode 8 are etched by use of hydrochloric acid or the like to form a base mesa. At first, the technique studied by the inventors of the present invention will be explained. FIG. 12 through FIG. 19 show by cross-sectional view and plan view the principal portion of the substrate of a semiconductor device during the fabrication process, illustrating the effectiveness of this embodiment. FIG. 20 and FIG. 21 show by plan view the principal portion of the substrate of the semiconductor device (HBT) of this embodiment, illustrating the shape of the base mesa.

The base mesa is etched to have virtually the same shape as the composite planar pattern of the base electrode 8 and emitter mesa 6a so that the base-collector capacitance decreases, as mentioned previously.

FIG. 3 shows by dotted line the imaginary composite planar pattern of the base electrode 8 and emitter mesa 6a

(including the area BE). This composite planar pattern is rectangular in shape, and it has sides BML1 and BML2 extending in the y direction and sides BML3 and BML4 extending in the x direction. The pattern will be indicated by PA when necessary.

It is desirable to have smaller distances in regard to the distance Lb3 between the side BML3 of composite planar pattern PA and the side BEL3 of base electrode, the distance Lb2 between the side BML2 and the side BEL2, the distance Lb1 between the side BML1 and the side BEL5, and the distance Lb4 between the side BML4 and the side BEL4. It is also desirable from the viewpoint of the reduction of base-collector capacitance to set the distances Lb1, Lb2, Lb3 and Lb4 so that they are smaller relative to the distance Le1 between the side BML1 and the side EML1 of emitter mesa and the distance Le4 between the side BML4 and the side EML4 thereof (refer to FIG. 3 and left-hand portion of FIG. 20). Particularly, it is desirable to form a base mesa such that the distance between the edge of the base electrode and the base mesa is smaller than the distance between the edge of the emitter mesa and the base mesa.

Figure 12:
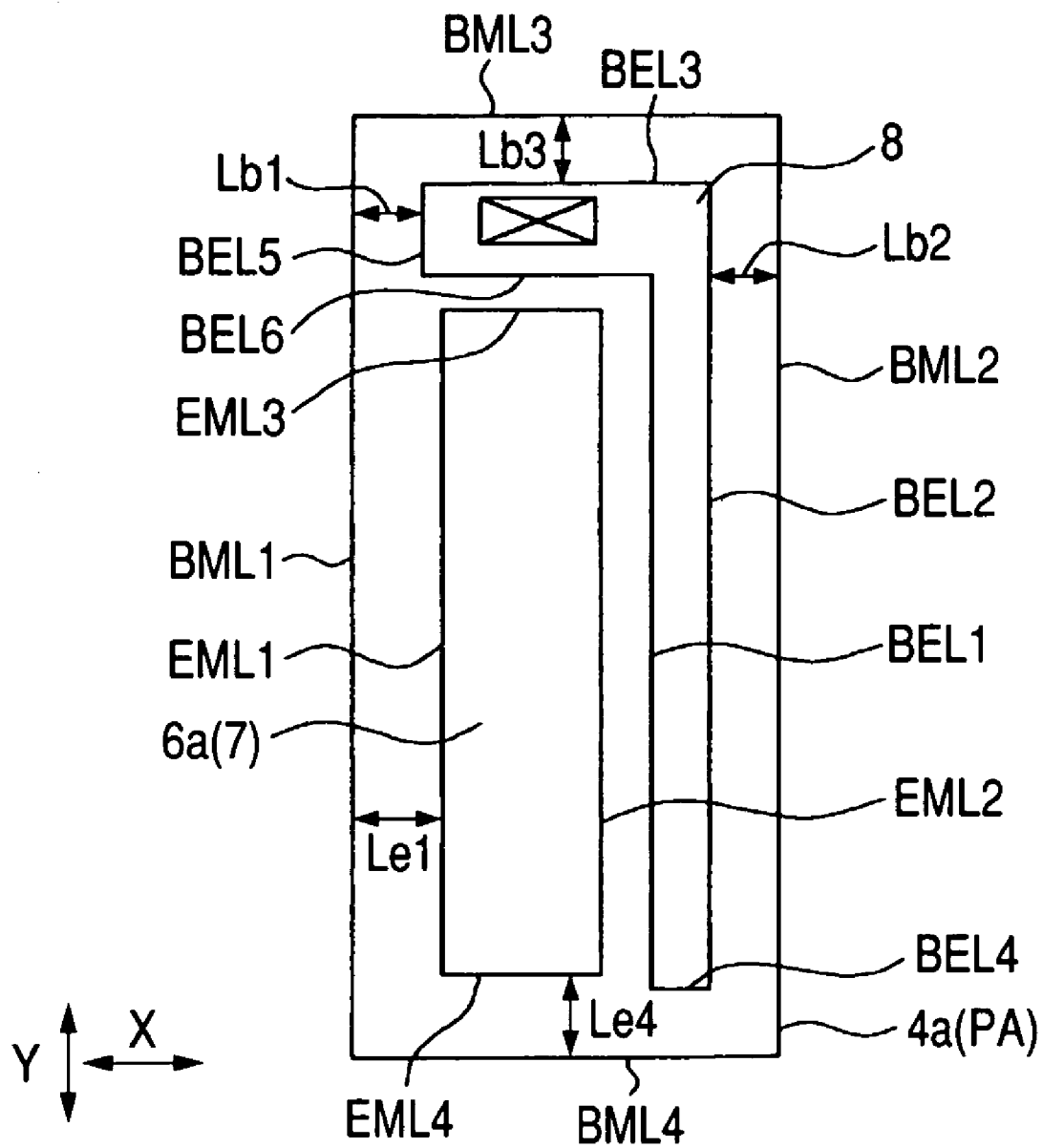
FIG. 12 is a plan view of the principal portion of the substrate, showing the semiconductor device (HBT) fabrication method and illustrating the effectiveness of the first embodiment of this invention.
Figure 13:
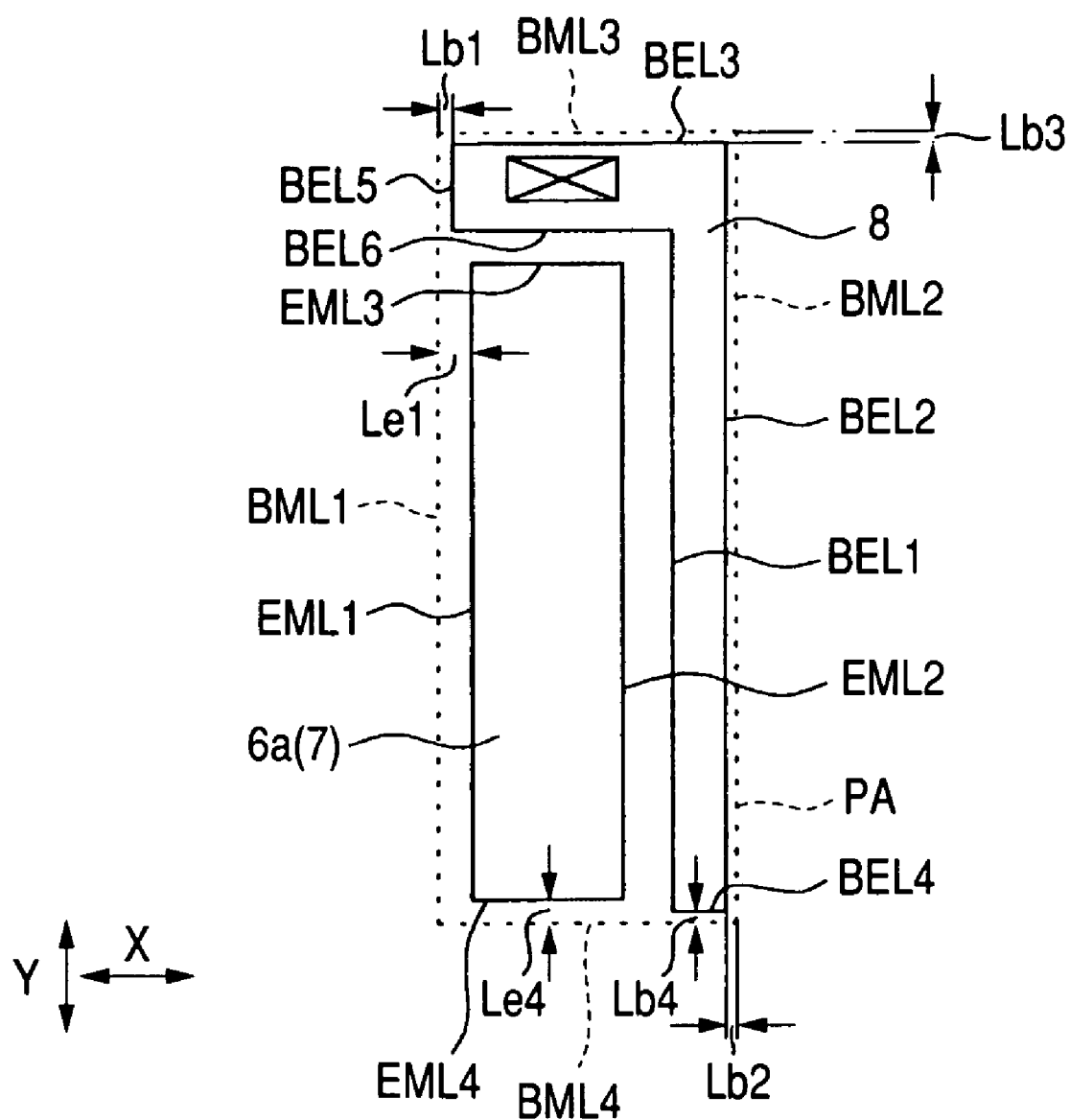
FIG. 13 is a plan view of the principal portion of the substrate, showing the semiconductor device (HBT) fabrication method and illustrating the effectiveness of the first embodiment of this invention.

For example, a bipolar transistor having its base mesa formed to have distances Lb1, Lb2 and Lb3 as small as 0.1 μm can have a smaller base-collector capacitance per unit emitter area as compared with a bipolar transistor with the respective distances set to be about 0.7-1.5 μm, and an amplifier based on this bipolar transistor can have an enhanced current appending efficiency and current gain. In FIG. 12, the side lengths are: Lb1=1 μm, Lb2=1 μm, Lb3=1 μm, Le1=1.5 μm, and Le4=1.5 μm. Accordingly, the base mesa (composite planar pattern PA) has its dimensions set such that the distances Lb1, Lb2, Lb3 and Lb4 are all about 0.1 μm as shown in FIG. 13.

Figure 14:
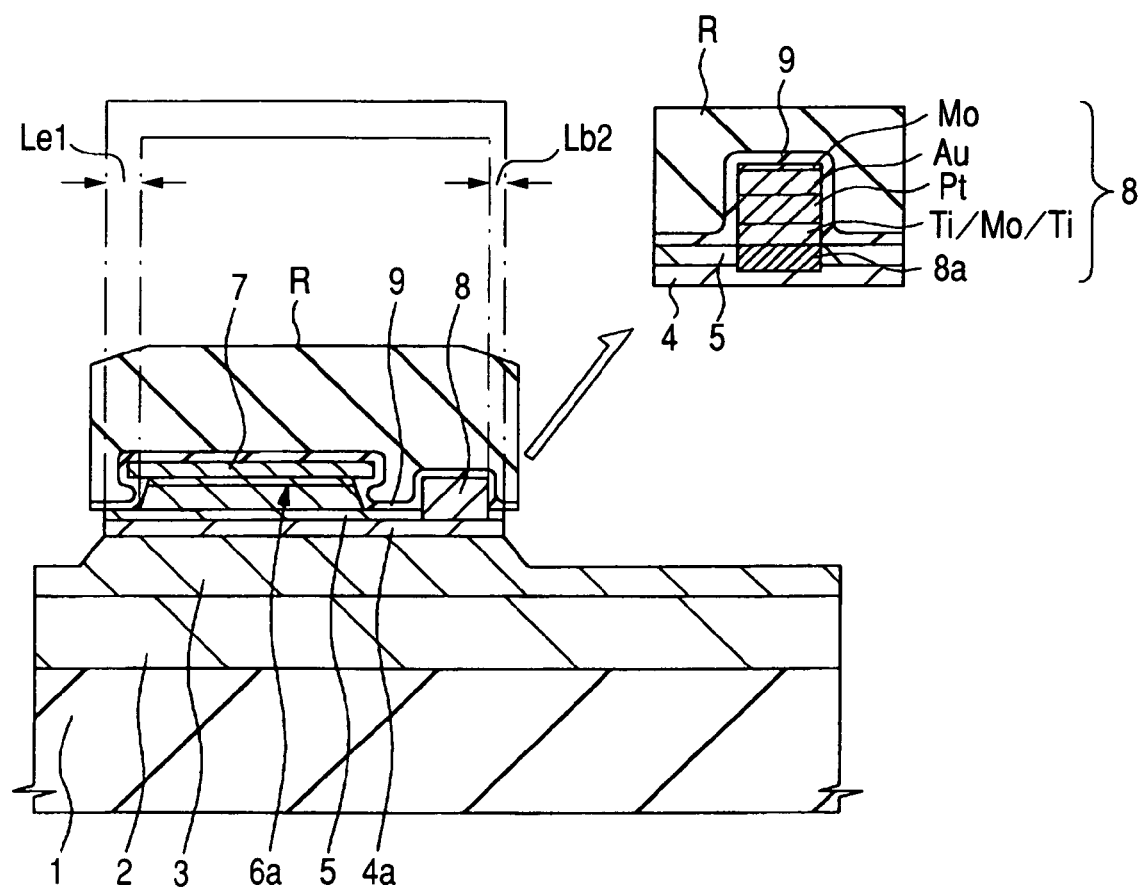
FIG. 14 is a cross-sectional view of the principal portion of the substrate, showing the semiconductor device (HBT) fabrication method and illustrating the effectiveness of the first embodiment.

In the fabrication, as shown in FIG. 14, a mask of the insulating film 9, for example, is formed; a resist film R is formed on it, the resist film R is treated by photolithographic process; and the insulating film 9 is etched by use of the resist film R as a mask. Consequently, the insulating film 9 is left on the composite planar pattern. After that, the resist film R is removed, and the base layer 4 is etched by use of the insulating film 9 as a mask. The resist film R does not exist at the time of etching of the base layer 4, although it appears in FIG. 14. (This arrangement is common to FIG. 16 through FIG. 19.)

Figure 15:
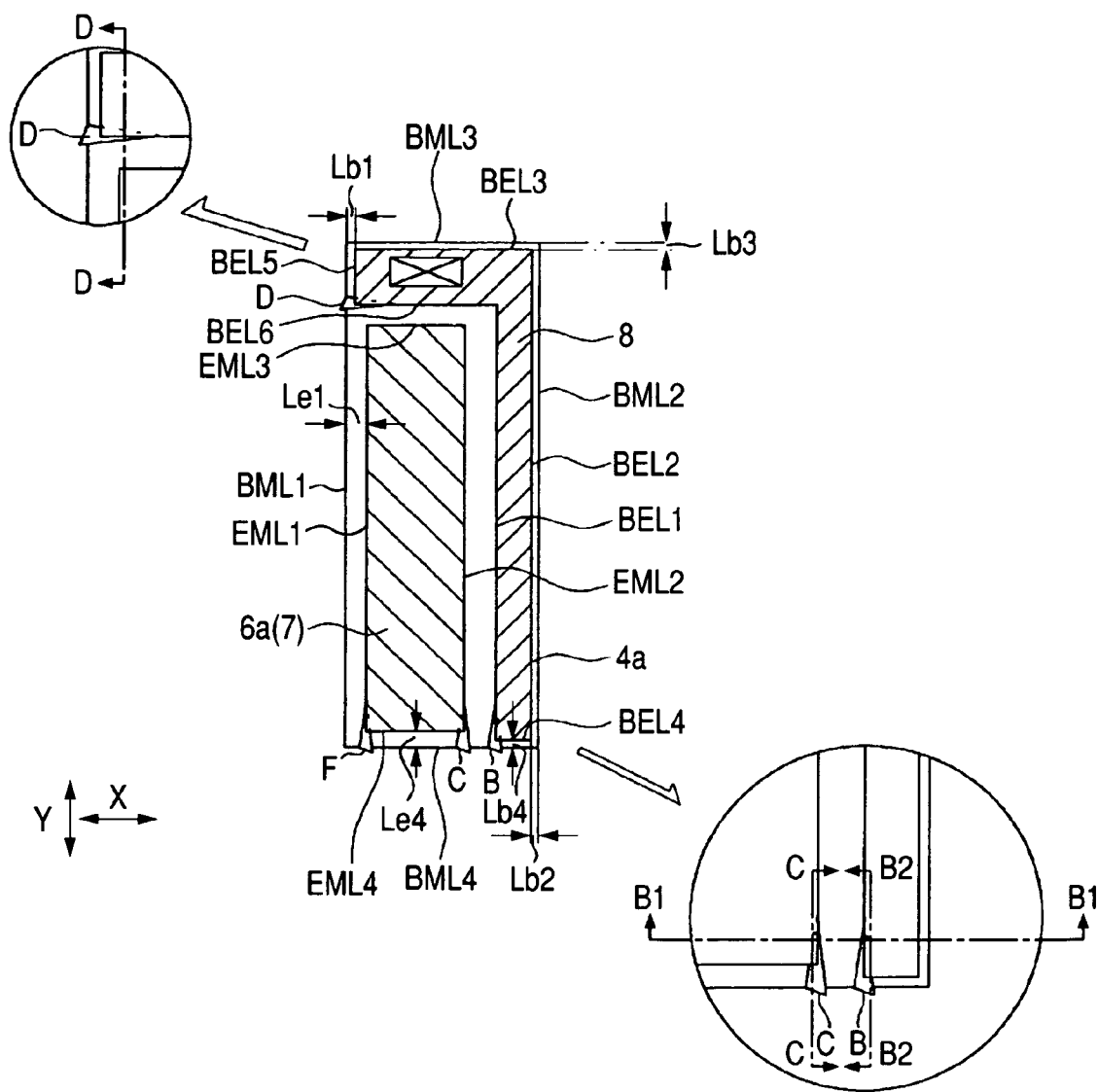
FIG. 15 is a plan view of the principal portion of the substrate, showing the semiconductor device (HBT) fabrication method and illustrating the effectiveness of the first embodiment.

Obviously, for this process, the insulating film 9 is formed to be slightly larger than the composite planar pattern in consideration of over-etching in the lateral direction of the base layer 4, so that the etched base layer 4 (base mesa 4a) coincides on its edges with the composite planar pattern. This etching process may be carried out to treat the base layer 4 inclusive of the n-type GaAs layer (collector layer) 3 below it. Specifically, the n-type GaAs layer (collector layer) 3 is etched by about 300 nm, while leaving about 400 nm. By this etching process, the base mesa 4a is formed. The base mesa may be conceived to include the etched trapezoidal n-type GaAs layer (collector layer) 3. Although the etching process uses the insulating film 9 as a mask, another film may be used. The resist film may be used for the mask at the time of etching. However, the practice based on this alternative scheme revealed abnormal etching 10 at positions B, C and D, as shown in FIG. 15. Abnormal etching also arose occasionally at position F.

Figure 16:
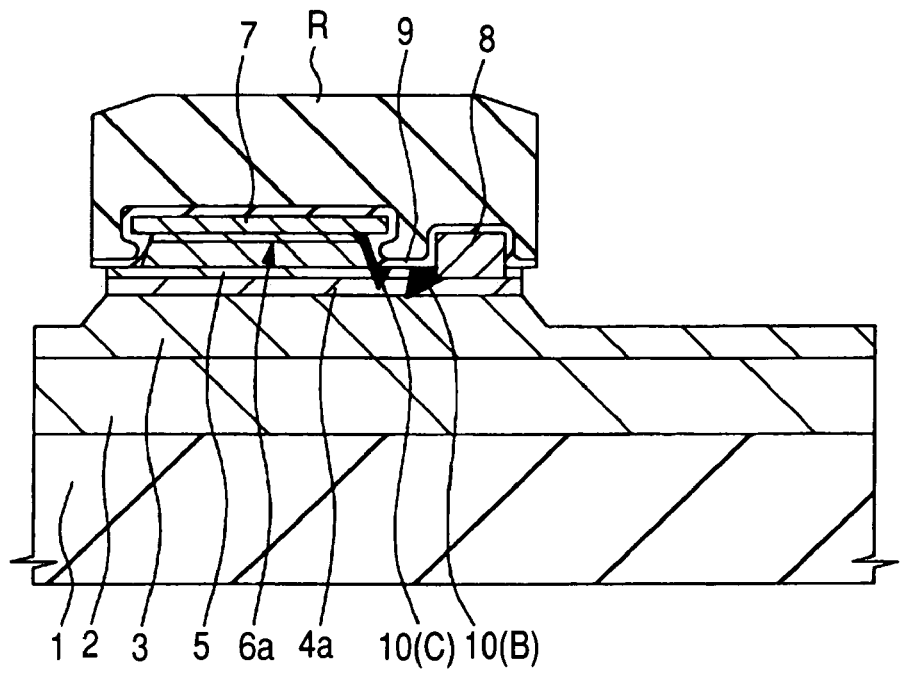
FIG. 16 is a cross-sectional view taken along line B-B in FIG. 15.
Figure 17:
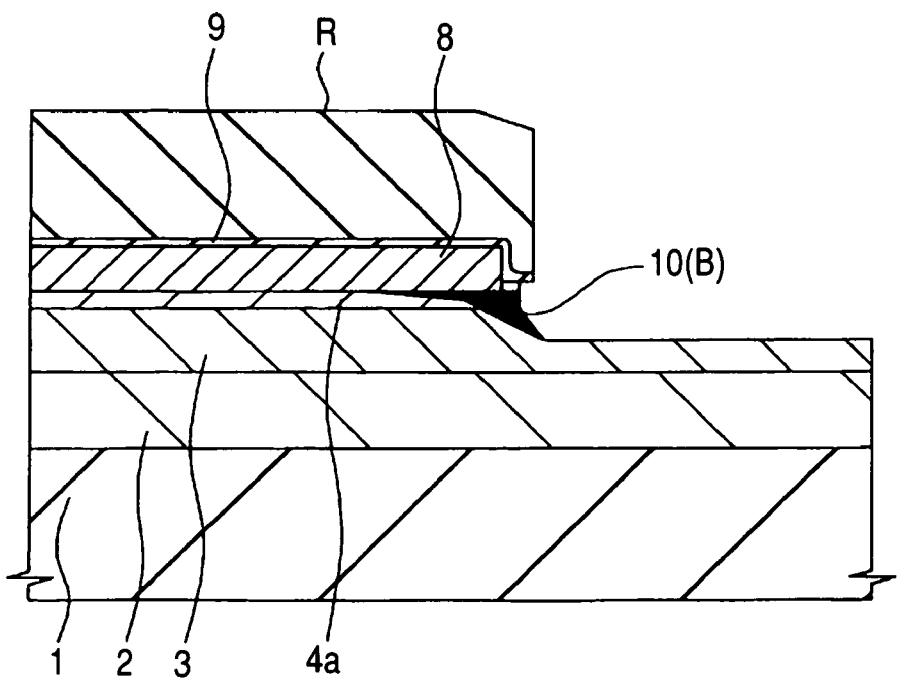
FIG. 17 is a cross-sectional view taken along line B2-B2 in FIG. 15.
Figure 18:
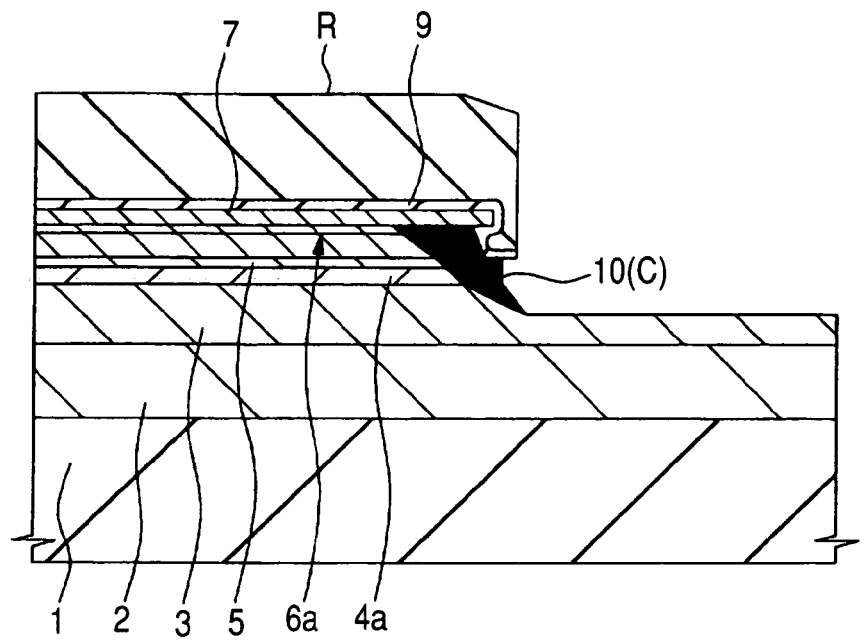
FIG. 18 is a cross-sectional view taken along line C-C in FIG. 15.
Figure 19:
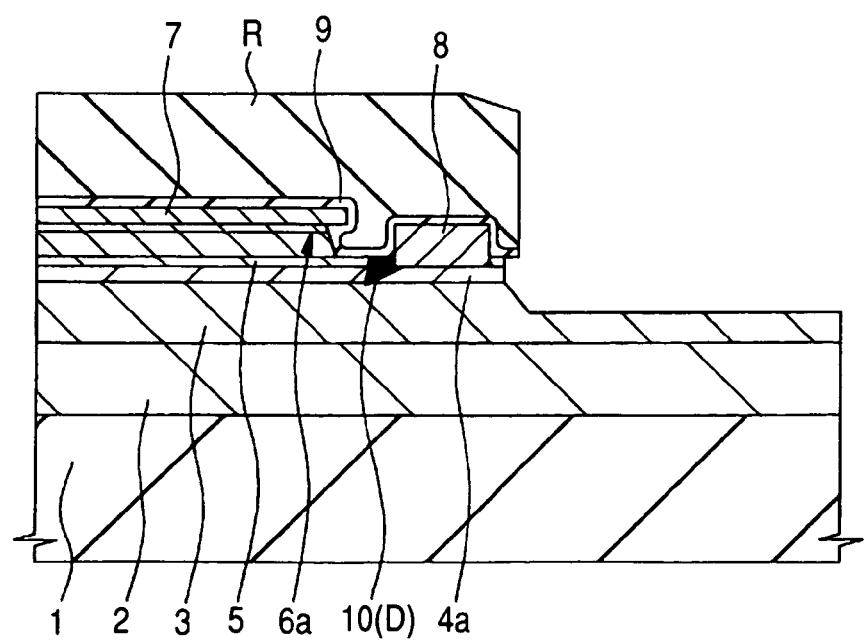
FIG. 19 is a cross-sectional view taken along line D-D in FIG. 15.

FIG. 16 shows a cross section taken along the line B1-B1 in FIG. 15 (cross section of positions B and C in the x direction); FIG. 17 shows a cross section taken along the line B2-B2 in FIG. 15 (cross section of position B in the y direction); FIG. 18 shows a cross section taken along the line C-C in FIG. 15 (cross section of position C in the y direction); FIG. 19 shows the cross section taken along the line D-D in FIG. 15 (cross section of position D in the y direction).

Abnormal etching mentioned here signifies the etching in excess of the allowable value of over-etching. The study conducted by the inventors of the present invention revealed abnormal etching which is as long as two to eight times (1-4 μm) the thickness (e.g., 0.5 μm) of the layer to be etched by this process. If etching of the same degree as that in the longitudinal direction is assumed to advance also in the lateral direction, it is as much as two to eight times in the lateral direction. The depth is 100 nm or larger, e.g., more than the thickness of base mesa (refer to FIG. 17).

First, abnormal etching at position B will be examined (refer to FIG. 15 through FIG. 17). FIG. 20 shows in the left-hand section a pattern diagram which is derived from FIG. 15 and redrawn in different longitudinal and lateral scales for the sake of easy understanding.

The conceivable cause of abnormal etching 10 at position B is that the distance from the edge of base electrode 8 (side BEL1) to the edge of insulating film 9 (side BML4) is made smaller in order to make the base mesa 4a smaller, and the etching liquid (e.g., hydrochloric acid) penetrating into the gap between the insulating film 9 and the base mesa 4a soaks along the base electrode 8 (side BEL1), causing aggressive etching to take place.

Particularly, Au and Pt which form the base electrode 8 have rough contact with the resist film and insulating film, allowing the etching liquid to soak easily. The reactive section (alloy section) 8a has poor etching selectivity as compared with other portions, and it is liable to undergo active etching. The interface between metallic stuff, such as the base electrode 8, and semiconductor stuff (e.g., GaAs) is subjected to etching attributable to the cell action.

Once the etching liquid soaks in to create a recess, more etching liquid enters into the recess, causing aggressive etching to take place. Since the metallic components of the base electrode 8 are immune to etching obviously, abnormal etching advances along the edge (side BEL1) of base electrode 8.

Such abnormal etching occurs in case the distance is small between the sides of the planar pattern of the base electrode 8 and the sides of composite planar pattern (formation area of insulating film 9) at the portions where these sides intersect. Specifically, the intersectional portion (position B) of the sides BEL1 and BML4 and the intersectional portion (position D) of the sides BEL6 and BML1 are likely portions for abnormal etching. In contrast, the intersectional portion of the sides BEL2 and BML4 and the intersectional portion of the sides BEL3 and BML1 are not subjected to abnormal etching, since the entire base mesa is retracted along the sides. The value of the retraction (over-etching in the lateral direction) is controllable based on the adjustment of the formation area of the insulating film 9 (resist film R), and it does not matter.

Similar abnormal etching also occurs on the edges of the emitter mesa 6a. Specifically, abnormal etching occurs in case the distance is small between the sides of the planar pattern of the emitter mesa 6a and the sides of composite planar pattern (formation area of insulating film 9) at the portions where these sides intersect. For example, the intersectional portion (position C) of the sides EML2 and BML4 is a likely portion for abnormal etching. In the case of a large Le1, abnormal etching arises at the intersectional portion (position F) of the sides EML3 and BML4. Although taking precaution against abnormal etching for the position F is significant, it is more crucial to take precaution for the positions B, C and D where abnormal etching results in a higher resistance between the base layer and the emitter layer, as will be explained later. The intersectional portion of the sides EML3 and BML1 (position E in FIG. 20) does not exhibit the occurrence of abnormal etching due to their large distance.

In other words, abnormal etching occurs in the area BE where the base electrode 8 and the emitter mesa 6*a* confront each other (refer to the hatched portion of FIG. 20), i.e., in case the distance is small between the edges of the area defined by the sides EML3 and EML2 of the emitter mesa 6*a* and the sides BEL6 and BEL1 of the base electrode 8 and the edges of the insulating film 9 (resist film R). Abnormal etching also occurs at portions of small distance between the ends of the above-mentioned four sides and the sides of the composite planar pattern (base mesa).

For dealing with this matter, this embodiment is designed to provide jut regions Pa and Pb for the positions B and C of FIG. 15, as shown in FIG. 4. FIG. 20 shows this pattern modification.

Specifically, a jut region Pa is formed in the direction of extension of the sides BEL1 and EML2 at the positions B and C (on the side BML4), and another jut region Pb is formed in the direction of extension of the side BEL6 at the position D (on the side BML1). A jut region Pa may be provided for each of the positions B and C, or these jut regions may be expanded to become a unified area. The jut region Pa may be made to cover the entire span of the side BML4, instead of only the section close to the positions B and C as shown in FIG. 4, in which case abnormal etching can also be prevented at the position F.

This embodiment is designed to have the further provision of a jut region Pc for the position B on the side BML2, as shown in FIG. 4. In this respect, when the base electrode 8 is narrow (short in side BEL4), abnormal etching can possibly advance along the side BEL1 from the side BEL4. Therefore, in case the distance is small between the positions B and D, where the sides of the planar pattern of the base electrode 8 and the sides of the composite planar pattern PA (formation area of insulating film 9) intersect, and the sides of the composite planar pattern PA, a jut region is appended on the side BML2. At the position D, where the distance is large to the side BML3, no jut region is appended to this side.

According to this embodiment, the provision of jut regions Pa, Pb and Pc for the composite planar pattern PA prevents the occurrence of abnormal etching during the etching process of the base layer.

Figure 5:
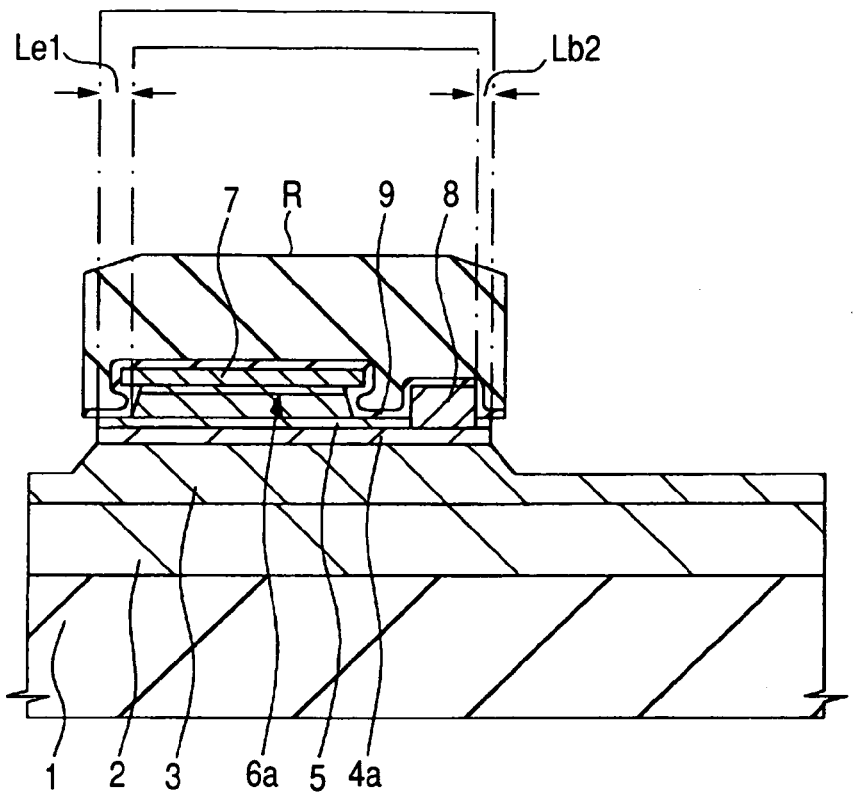
FIG. 5 is a cross-sectional view of the principal portion of the substrate, showing the semiconductor device (HBT) fabrication method of the first embodiment.

In the fabrication, as shown in FIG. 5, a mask of the insulating film 9 for example is formed on the composite planar pattern PA and the jut regions Pa, Pb and Pc; a resist film R is formed on it; the resist film R is treated by photolithographic process; and the insulating film 9 is etched by use of the resist film R as a mask. Consequently, the insulating film 9 is left on the composite planar pattern. After that, the resist film R is removed, and the base layer 4 is etched by use of the insulating film 9 as a mask.

Obviously, for this process, the insulating film 9 is formed to be slightly larger than the composite planar pattern in consideration of over-etching in the lateral direction of the base layer 4, so that the etched base layer 4 (base mesa 4*a*) coincides on its edges with the composite planar pattern. This etching process may be carried out to treat the base layer 4 inclusive of the n-type GaAs layer (collector layer) 3 below it. Specifically, the n-type GaAs layer (collector layer) 3 is etched by about 300 nm, while leaving about 400 nm. By this etching process, the base mesa 4*a* is formed. The base mesa may be conceived to include the etched trapezoidal n-type GaAs layer (collector layer) 3. Although the etching process uses the insulating film 9 as a mask, another film may be used. The resist film may be used for the mask at the time of etching.

In consequence, the bipolar transistor can have enhanced characteristics in contrast to the case where abnormal etching occurs.

Such abnormally etched portion 10, as described with reference to FIG. 15 through FIG. 19, becomes a recess (void), or it is filled with the insulating film, as will be explained later. On this account, the resistance increases between the base layer and the emitter layer, resulting in a decreased base-emitter current (Ibe). As a result, the bipolar transistor has degraded characteristics, such as a lower rating of collector current Ic.

In contrast, this embodiment of the present is capable of preventing abnormal etching, thereby preventing an increase in the resistance between the base layer and the emitter layer, whereby it can improve the characteristics of the bipolar transistor in terms of the collector current Ic or the like.

According to this embodiment, jut regions are provided only for the portions where abnormal etching occurs, and this can reduce the base-collector capacitance per unit emitter area as compared with the case shown in FIG. 12, for example.

The distances LbFa, LbFb and LbFc from the base electrode 8 to the edges of the jut regions is larger than the distances Lb2 and Lb3 (LbFa>Lb2, LbFb>Lb2, LbFc>Lb2, LbFa>Lb3, LbFb>Lb3, and LbFc>Lb3) as shown in FIG. 4. The distance (LeFa) from the emitter mesa 6*a* to the edges of the jut regions is larger than the distances Lb2 and Lb3 (LeFa>Lb2 and LeFa>Lb3). LeFa is larger than Le1.

Although, in FIG. 4, abnormal etching can possibly occur in the area between the side BEL5 of base electrode 8 and the jut region Pb, it does not advance to the side BEL6 and is less problematic. Similarly, although abnormal etching can possibly occur in the area between the side BEL2 of the base electrode 8 and the jut region Pc, it does not advance to the side BEL1 and is less problematic.

Next, the distances LbFa, LbFb and LbFc from the base electrode 8 to the edges of jut regions will be examined. The above-mentioned abnormal etching was observed in the case of distances Lb1, Lb2 and Lb3 set to be 0.5 μm or less (refer to FIG. 15).

First, the disparity dLb of the distance between the base electrode 8 and the base mesa 4*a* will be examined.

Possible causes of the disparity dLb are for example: (1) alignment error dLb1 between the base electrode and the base mesa, (2) dimensional error dLb2 of the base electrode, and (3) dimensional error dLb3 of the resist film used for the formation of the base mesa. Specifically, for example, dLb1 is about 0.3 μm, dLb2 is about 0.1 μm, and dLb3 is about 0.1 μm. Another cause is: (4) dimensional error dLb4 of the side etching (over-etching) of the base mesa, and it is about 0.4 μm. The dimensional error of the side etching of the base mesa varies depending on the etching condition. Although the actual value of the side etching is conceivably about 10% of the etching value in the longitudinal direction at the formation of base mesa 4*a*, i.e., the depth of base mesa 4*a* (inclusive of the portion of trapezoidal n-type GaAs layer 3, i.e., 100 nm+300 nm), it is assessed to be equal to the depth DE of base mesa 4*a* (inclusive of the portion of trapezoidal n-type GaAs layer 3).

The square of disparity dLb is equal to the squared sum of the errors dLb1 through dLb4, i.e., $(dLb)^2=(dLb1)^2+$ $(dLb2)^2+(dLb3)^2+(dLb4)^2$, or $0.11+(dLb4)^2$, and accordingly the disparity dLb is about 0.52 μm. Accordingly, even if the mask is designed such that the distances between the base electrode 8 and the base mesa 4a, e.g., Lb1, Lb2 and Lb3, become 0.5 μm, the actual distances will be 0.5±Lb (ranging from −0.02 to 1.02).

A negative distance signifies that the base mesa 4a retracts from the edge of base electrode 8. In this case, the etching liquid is particularly liable to soak in to invite abnormal etching.

As described above, abnormal etching advances by about 1-4 μm along the base electrode, for example, and it has a depth of 100 nm or larger, e.g., it becomes deeper than the thickness of the base mesa (refer to FIG. 17). Therefore, it is necessary to determine the dimensions (LbFa, LbFb and LbFc) of the jut regions in consideration of the foregoing dimensional disparity and the degree of abnormal etching.

This embodiment is designed to have the dimensions LbFa, LbFb and LbFc set larger than the depth DE of the base mesa 4a (inclusive of the portion of trapezoidal n-type GaAs layer 3, i.e., 100 nm+300 nm) plus 0.3 μm.

Specifically, these dimensions LbFa, LbFb and LbFc are set to be 0.7 μm (0.4+0.3 μm) or larger.

Next, the distance LeFa from the emitter mesa 6a to the edge of the jut region will be examined.

Abnormal etching also arises along the emitter mesa 6a. For example, abnormal etching can possibly occur when the distance Le4 is 0.5 μm or less (refer to FIG. 15). On this account, this embodiment is designed to have the distance LeFa set to be larger than the depth DE of the base mesa 4a (inclusive of the portion of trapezoidal n-type GaAs layer 3, i.e., 100 nm+300 nm) plus 0.3 μm. Specifically, the dimension LeFa is set to be 0.7 μm (0.4+0.3 μm) or larger.

In case the distance between the edges of the emitter mesa and the base mesa is small, the leakage current through the junction of the emitter and base layers can possibly increase. Therefore, this distance is preferably set to be at least 0.5 μm. On this account, with the intention of reducing the leakage current, the dimensions Le1 is set to be 0.5 μm and the dimensions LeFa is set equal to the depth DE of base mesa 4a (inclusive of the portion of trapezoidal n-type GaAs layer 3, i.e., 100 nm+300 nm) plus 0.3 μm. Specifically, the dimension LeFa is set to be about 1.2 μm (0.5+0.4+0.3 μm). In other words, the dimensions LeFa is set equal to the average distance between the edge of emitter mesa and the edge of base mesa excluding the jut region Pa, plus DE plus 0.3 μm.

For example, the inventors of the present invention have determined that the dimension of each portion of FIG. 4 in the course of examination is: Lb2=0.1 μm, LbFc=1.0 μm (larger than Lb2), Lb3=0.1 μm, LbFb=1.0 μm (larger than Lb3), Le1=0.8 μm, and LeFa=1.5 μm (larger than Le1). The dimension Le1 was set to be as large as 0.8 μm with the intention of reducing the leakage current through the junction of the emitter and base layers. The size of the emitter mesa was set to be about 4 μm by 20 μm (common to FIG. 12).

As a consequence, it was possible to reduce the area of the base mesa by about 20% and to reduce the base-collector capacitance by about 20% from the case of the layout shown in FIG. 12. It was also possible to suppress an increase of the base-emitter resistance caused by the occurrence of abnormal etching.

Next, the fabrication process after the formation of base mesa 4a will be explained. An insulating film (e.g., silicon oxide film) 13 is deposited to a thickness of about 100 nm on the substrate 1, as shown in FIG. 6.

Next, the insulating film 13 and n-type GaAs layer (collector layer) 3 are etched selectively to expose part of the n$^+$-type GaAs layer (sub-collector layer) 2.

Next, a collector electrode 15 is formed on the exposed n$^+$-type GaAs layer (sub-collector layer) 2. This electrode 15 also can be formed by the same lift-off process as that used for the base electrode 8. The collector electrode 15 consists of gold-germanium (AuGe), nickel (Ni) and Au layers laminated in this order from the bottom, for example.

Next, the n-type GaAs layer (collector layer) 3 and n$^+$-type GaAs layer (sub-collector layer) 2 outside of the collector electrode 15 are etched so that individual transistors are separated electrically. Separation of the transistors may be based on the implantation of p-type impurity into the n$^+$-type GaAs layer (sub-collector layer) 2 outside of the collector electrode 15 (i.e., pn separation). FIG. 7 shows in a plan view the principal portion of the substrate after the formation of the collector electrode 15. For example, a cross sectional view taken along the line A-A of FIG. 7 corresponds to FIG. 6. As shown in FIG. 7, multiple HBTs are formed on the substrate, with rectangular collector electrodes 15 being made to extend in the y direction among the base mesas 4a of the HBTs.

Next, an insulating film 17 of silicon oxide or the like is deposited on the substrate 1 by the CVD process.

Figure 9:
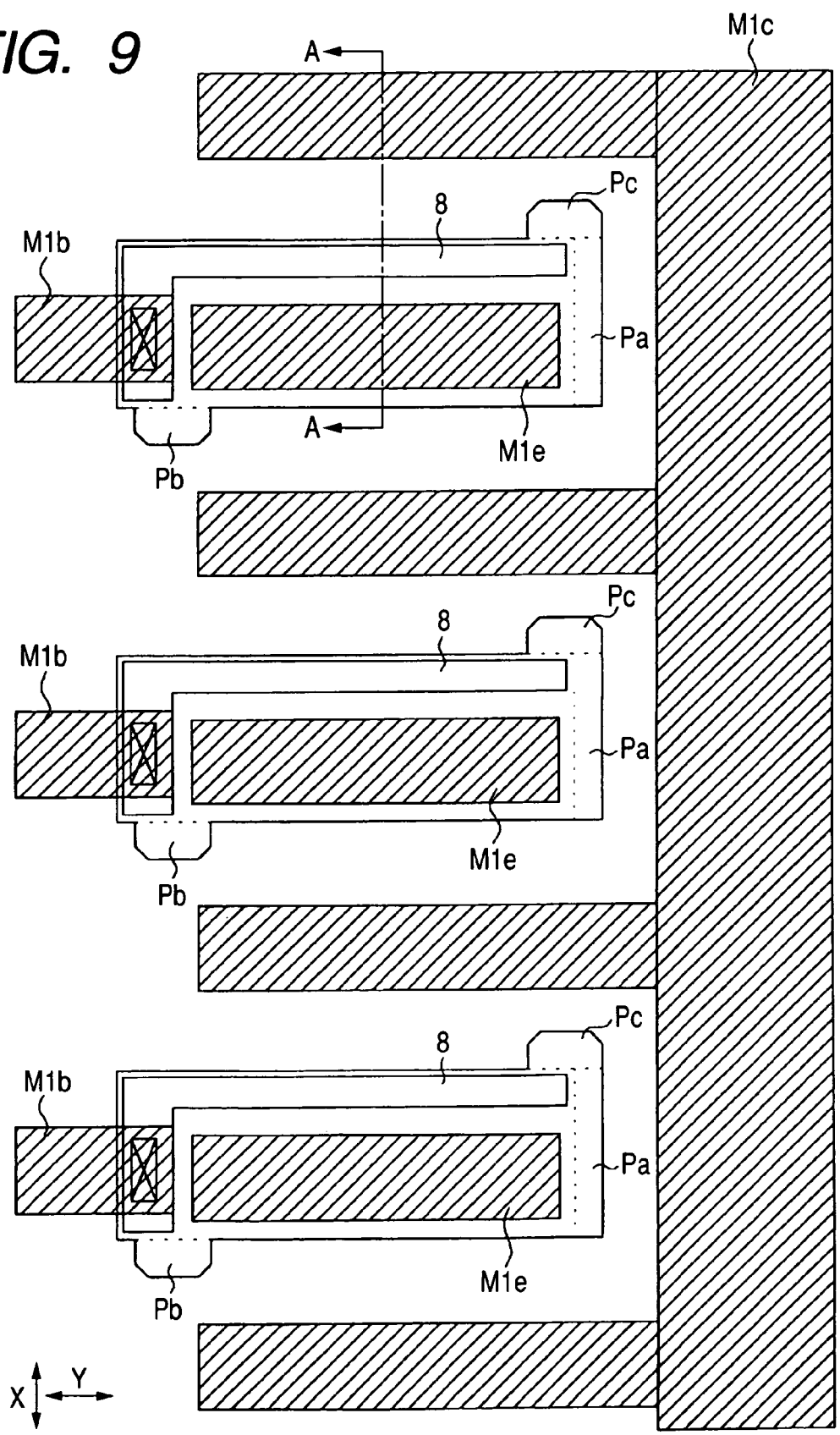
FIG. 9 is a plan view of the principal portion of the substrate, showing the semiconductor device (HBT) fabrication method of the first embodiment.
Figure 10:
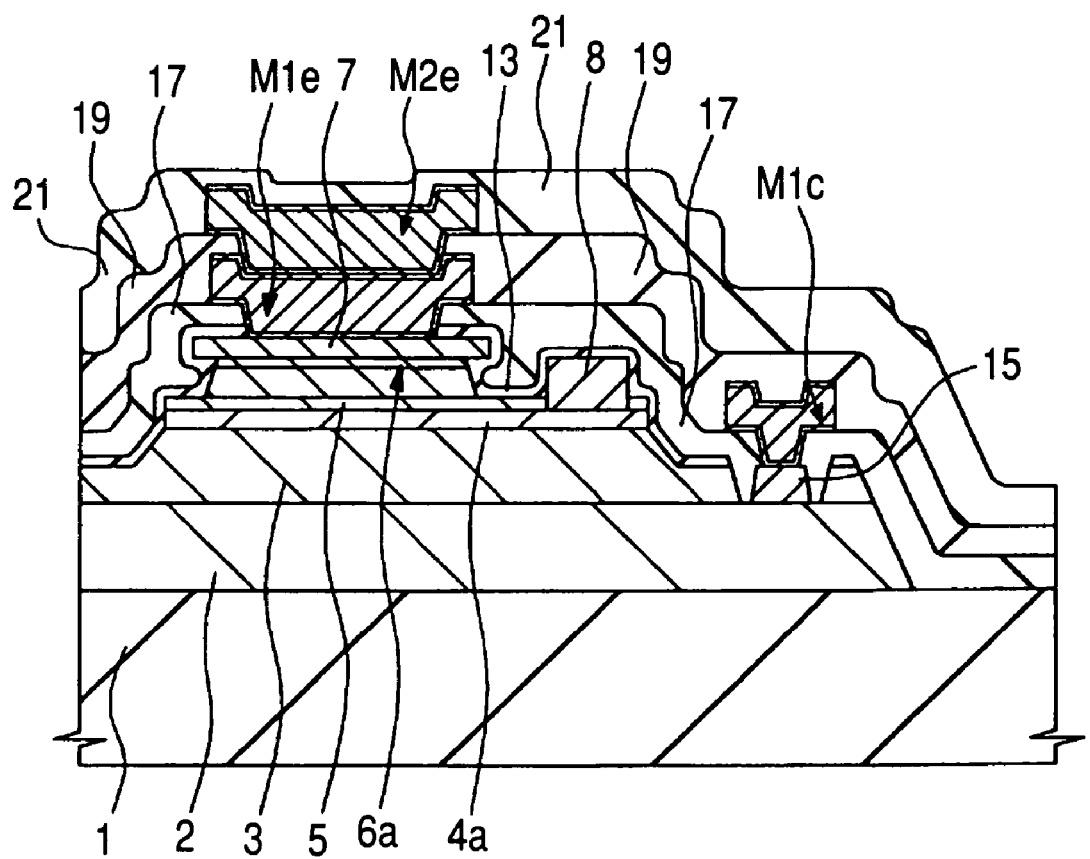
FIG. 10 is a cross-sectional view taken along line A-A in FIG. 11.

Next, the insulating film 17 on the emitter electrode 7 and collector electrode 15 is removed to form connection holes. At the same time, a connection hole is formed over the base electrode 8 (refer to FIG. 9). Next, a conductive film is formed by depositing a laminated film of molybdenum (Mo), Au, and Mo, for example, on the insulating film 17 inclusive of the interior of the connection holes. Next, the laminated film is etched to form an emitter lead line M1e, a base lead line M1b, and a collector lead line M1c. FIG. 9 shows in a plan view the principal portion of the substrate after the formation of these lead lines M1e, M1b and M1c. For example, a cross sectional view taken along the line A-A of FIG. 9 corresponds to FIG. 8. As shown in the figures, the emitter lead line M1e is formed over the emitter electrode 7; the base lead line M1b is led out in the y direction from the connection point on the base electrode 8; and the collector lead line M1c is formed to include line sections over the collector electrodes 15 and a line section running in the x direction to connect these line sections.

Next, an insulating film 19 of silicon oxide or the like is deposited on the first-layer wiring lines M1e, M1c, etc. by the CVD process, for example. Next, the insulating film 19 on the emitter lead line M1e is removed to make a connection hole. Next, a conductive film is formed by depositing a Mo/Au/Mo film, for example, on the insulating film 19 inclusive of the interior of the connection hole, and it is etched to form an emitter lead line (second-layer wiring) M2e.

Figure 11:
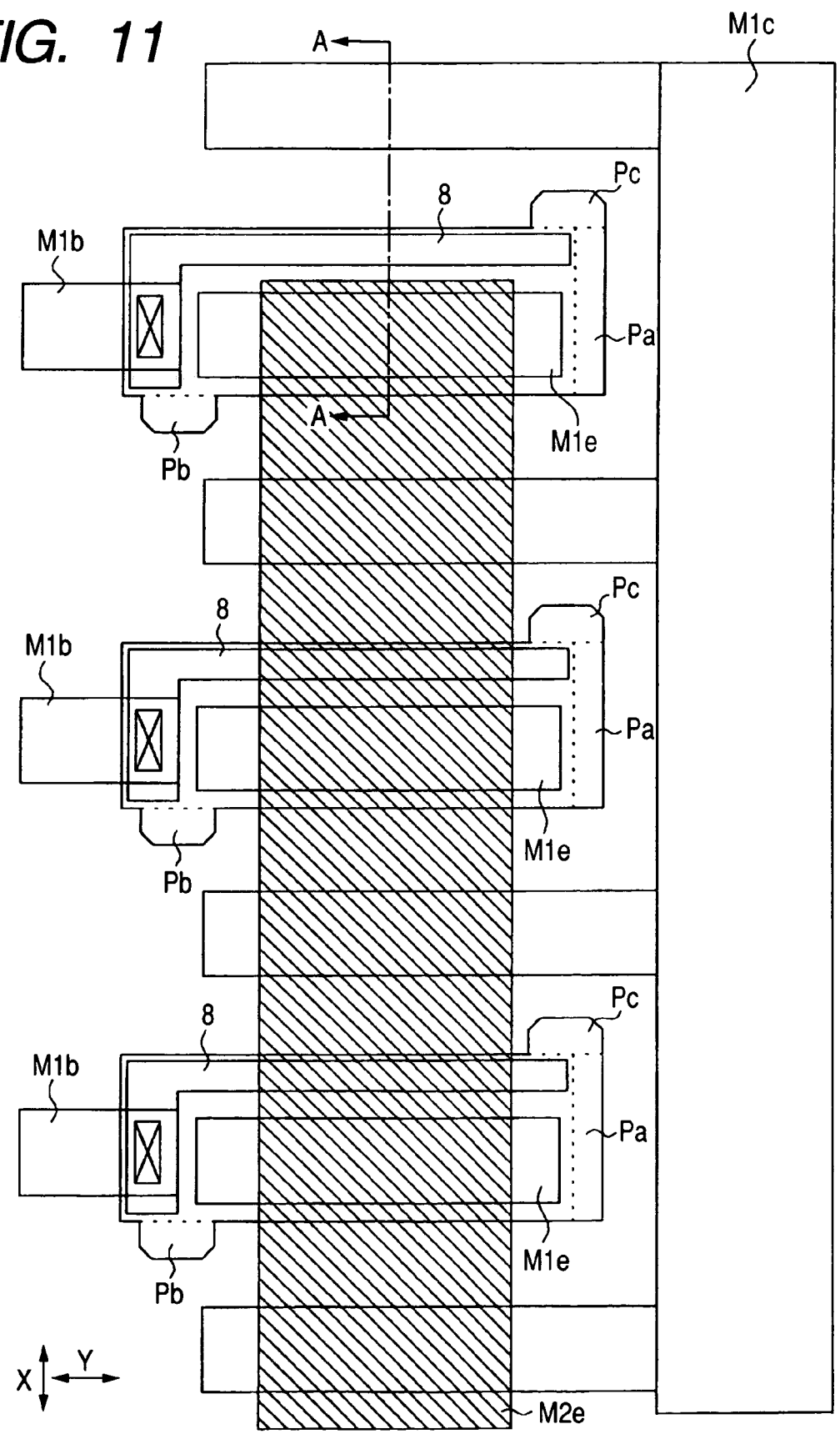
FIG. 11 is a plan view of the principal portion of the substrate, showing the semiconductor device (HBT) fabrication method of the first embodiment.

FIG. 11 shows in a plan view the principal portion of the substrate after the formation of the emitter lead line M2e. For example, a cross sectional view taken along the line A-A of FIG. 11 corresponds to FIG. 10. The emitter lead line M2e runs in the x direction to connect the emitter lead lines M1e, as shown in FIG. 11.

Next, an insulating film 21 of silicon oxide or the like is deposited on the second-layer wiring M2e.

Next, resistors, capacitors and other circuit elements as needed are formed in areas (not shown) of the substrate 1, and the substrate surface is coated with a protective film.

Next, the substrate 1 is turned to have its protective film side (element forming surface) facing downward, and the rear side of the substrate 1 is polished to become 70-100 μm in thickness. After that, rear-side electrodes and the like are formed when necessary. The substrate 1, which a circular wafer, is diced into separate semiconductor chips. Each semiconductor chip is packaged to complete a semiconductor device (HBT) based on this embodiment.

Embodiment 2

A second embodiment of this invention will be explained, which pertains to the layout of the base electrode and the emitter mesa. The structure of the semiconductor device and the formation process of this embodiment are the same as the preceding first embodiment, and a detailed explanation thereof will be omitted. Items identical to those of the first embodiment are referred to by the common symbols, and an explanation thereof will be omitted.

Figure 22:
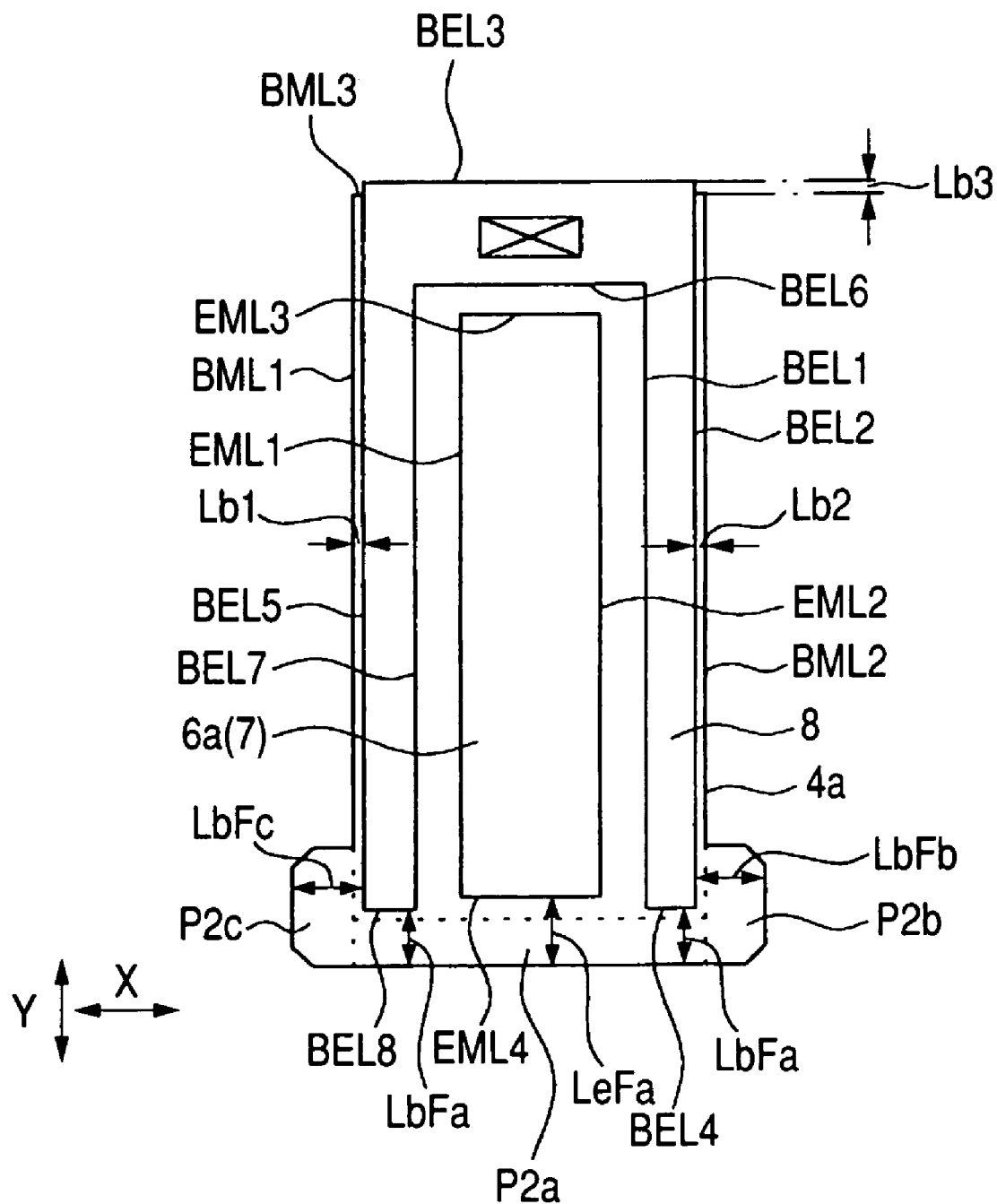
FIG. 22 is a plan view of the principal portion of a substrate of the semiconductor device (HBT) based on a second embodiment of this invention.

FIG. 22 shows in a plan view the principal portion of the semiconductor device of this embodiment. An emitter mesa (upper emitter layer) 6a and base electrode 8 are formed over the base mesa 4a. The emitter mesa 6a is a rectangular pattern extending in the y direction, and the base electrode 8 consists of first, second and third sections running along the three sides EML1, EML2 and EML3 of the emitter mesa 6a. The first and third sections extend in the y direction, and the second section runs in the x direction to connect the first and third sections at their ends.

A jut region P2a is provided on the edge of the area where the base electrode and the emitter mesa confront each other so as to increase the distance between the edge of the area and the edge of base mesa 4a.

In addition to the jut region P2a, there are jut regions P2b and P2c in this embodiment. Consequently, even if the base electrode 8 is narrow, it is possible to prevent abnormal etching from arising on the edge of the base mesa, advancing along the sides BEL4 and BEL8 in the x direction of the base electrode 8, and reaching the area where the base electrode and the emitter mesa confront each other.

Specifically, the distances are set to be: Lb1=0.1 µm, LbFc=1.0 µm, Lb2=0.1 µm, LbFb=1.0 µm, LeFa=1.5 µm, LbFa=1.0 µm, and Lb3=−0.3 µm.

BML1-BML3 denote sides of the pattern of the base mesa 4a; BEL1-BEL8 denote sides of the pattern of the base electrode 8; and EML1-EML4 denote sides of the pattern of the emitter mesa.

Figure 23:
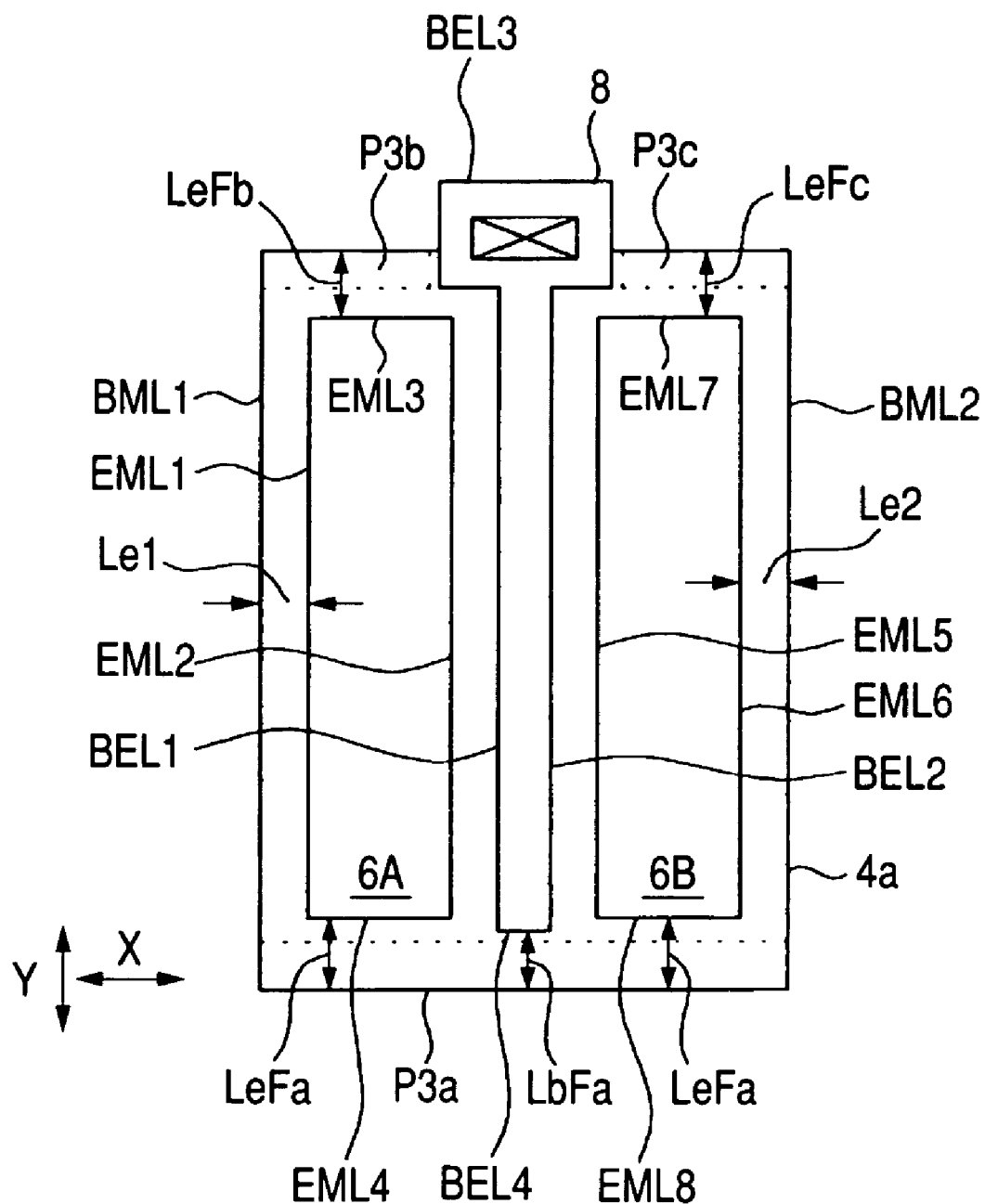
FIG. 23 is a plan view of the principal portion of a substrate of another semiconductor device (HBT) based on the second embodiment of this invention.

FIG. 23 shows in a plan view the principal portion of another semiconductor device based on this embodiment. Two emitter mesas (upper emitter layer) 6A and 6B are formed over a base mesa 4a, and a base electrode 8 is formed between the emitter mesas. The emitter mesas 6A and 6B are rectangular patterns extending in the y direction, and the base electrode 8 extends in the y direction between the emitter mesas. The base electrode 8 has a wide end section for the layout of a connection section.

Jut regions P3a, P3b and P3c are provided on the edges of areas where the base electrode and the emitter mesas confront each other so as to increase the distance between the edge of an area and the edge of the base mesa 4a.

Specifically, the distances are set to be: LeFa=1.5 µm, LbFa=1.0 µm, LeFb=1.5 µm, LbFc=1.5 µm, Le1=1.0 µm, and Le2=1.0 µm.

BML1 and BML2 denote sides of the pattern of the base mesa 4a; BEL1-BEL4 denote sides of the pattern of the base electrode 8; and EML1-EML8 denote sides of pattern of the emitter mesa. The base mesa 4a is formed also below the wide end section of the base electrode 8.

Based on the provision of jut regions for the base mesa, abnormal etching can be prevented from occurring at the time of formation of the base mesa. As a consequence, an increase in the resistance between the base layer and the emitter layer can be prevented, and the characteristics of the bipolar transistor can be improved in terms of the collector current Ic. In addition, based on the provision of jut regions only at positions where abnormal etching occurs, the base-collector capacitance per unit emitter area can be reduced.

Embodiment 3

A third embodiment of this invention will be explained, which includes a case where the patterns of the base electrode and the emitter mesa intersect the pattern of the base mesa, and a case where the planar pattern of base electrode has multiple bent sections or curving sections. The structure of the semiconductor device and the formation process of this embodiment are the same as those of the preceding first embodiment, and a detailed explanation thereof will be omitted. Items identical to those of the first embodiment are referred to by common symbols, and an explanation thereof will be omitted.

Figure 24:
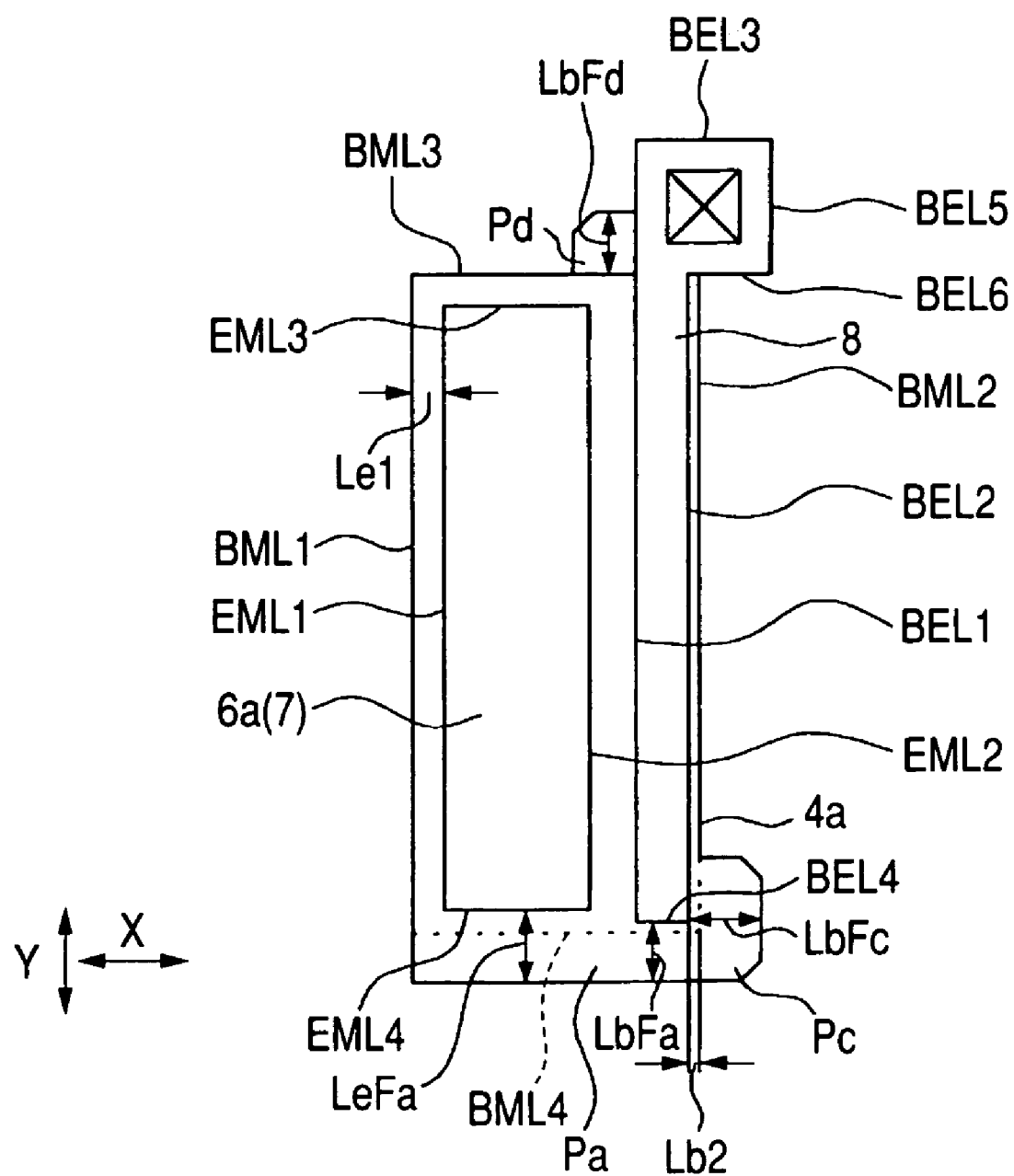
FIG. 24 is a plan view of the principal portion of a substrate of the semiconductor device (HBT) based on a third second embodiment of this invention.

FIG. 24 shows in a plan view the principal portion of the semiconductor device of this embodiment. An emitter mesa (upper emitter layer) 6a and base electrode 8 are formed over the base mesa 4a. The emitter mesa 6a is a rectangular pattern extending in the y direction, and the base electrode 8 is formed along the side EML2 of the emitter mesa 6a. The base electrode 8 has a contact section at its one end immediate to the emitter mesa side BML3.

The base electrode 8 intersects the base mesa 4a. In other words, the side BEL1 and the side BML3 of the composite planar pattern intersect. The composite planar pattern is a generally rectangular pattern defined by the sides BML1, BML2, BML3 and BML4.

In this pattern layout, a jut region Pd is provided at the intersection of BEL1 and BML3. The distance LbFd from the intersection of BEL1 and BML3 to the edge of the jut region Pd is larger than the distance Lb2, and it is set to be larger than the depth DE of the base mesa 4a (inclusive of the portion of trapezoidal n-type GaAs layer) plus 0.3 µm.

Based on the provision of this jut region Pd, it is possible to prevent abnormal etching from arising on the edge of the base mesa, advancing along the side BEL1 in the y direction of the base electrode 8, and reaching the area where the base electrode and the emitter mesa confront each other.

Also, in this case, which contrasts with the case of FIG. 24, where the edge of base electrode immediate to the contact section intersects the base mesa, and where there is an intersection of another edge of base electrode immediate to the opposite side BML4 and the base mesa, it is possible to prevent the occurrence of abnormal etching based on the provision of a jut region at this intersection.

Also, in this case, which contrasts with the foregoing, where the base electrode intersects the base mesa, and where there is an intersection of the emitter mesa and the base mesa, it is possible to prevent the occurrence of abnormal etching based on the provision of a similar jut region.

Next, the case where the planar pattern of the base electrode has multiple bent sections or curving sections will be explained with reference to FIG. 25 and FIG. 26, which show a principal portion of another semiconductor device of this embodiment.

Figure 25:
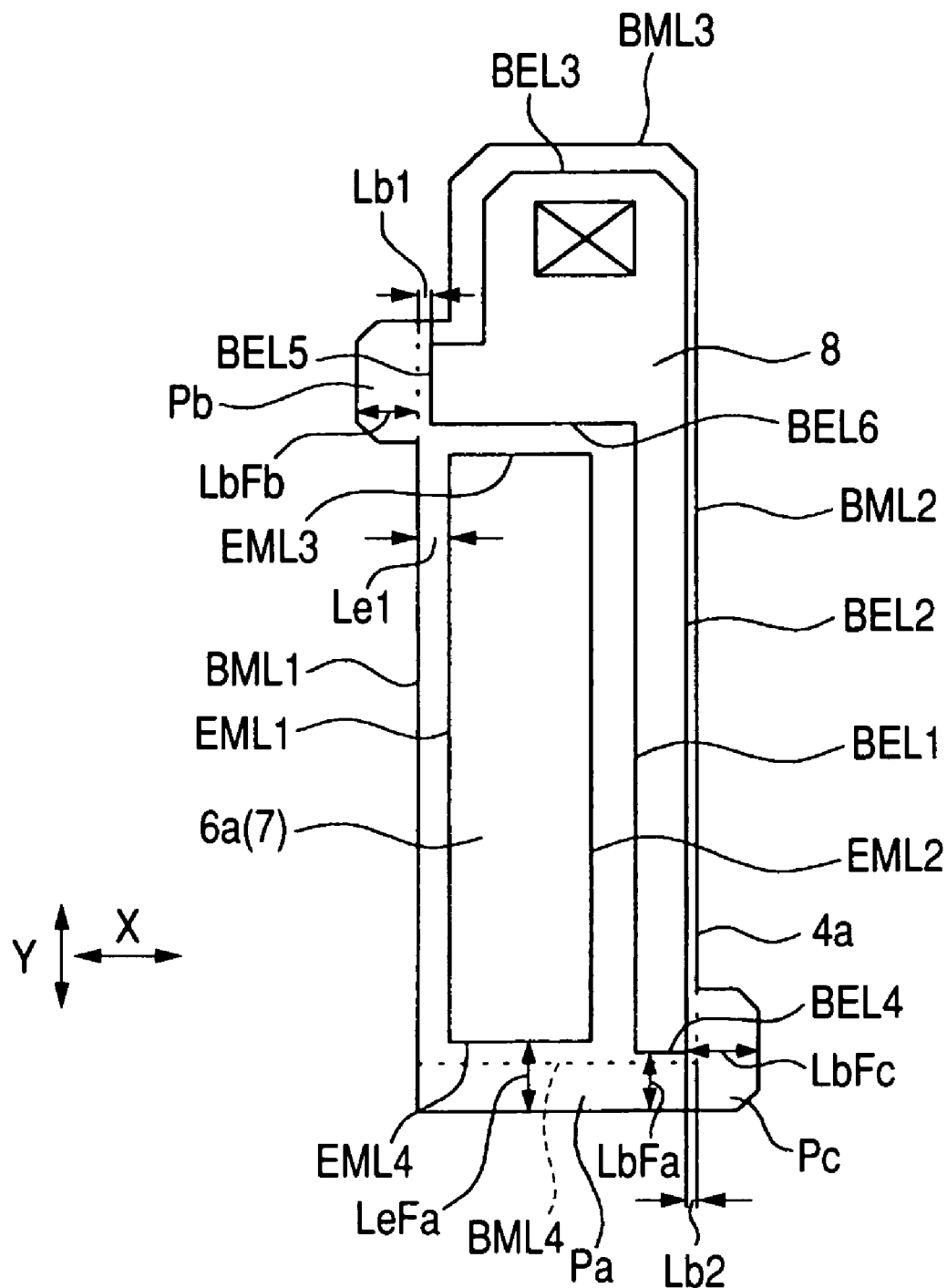
FIG. 25 is a plan view of the principal portion of a substrate of another semiconductor device (HBT) based on the third embodiment.
Figure 26:
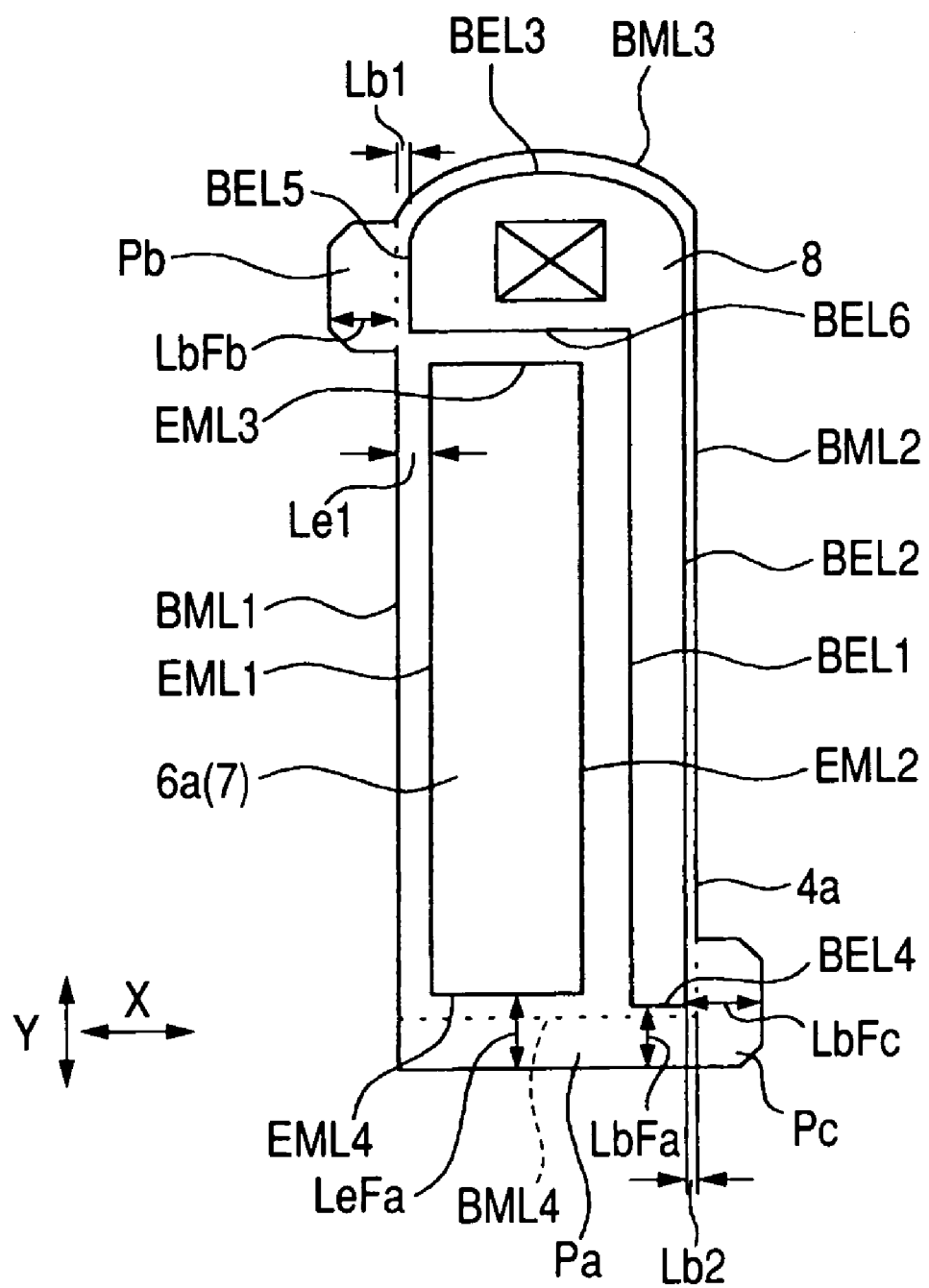
FIG. 26 is a plan view of the principal portion of a substrate of still another semiconductor device (HBT) of the third embodiment.

In contrast to the case shown in FIG. 24 and the cases of the first and second embodiments, where the patterns of regional sections have relatively simple shapes defined by generally straight lines, there can be a case where the contact section of the base electrode 8 has an intricate shape, as shown in FIG. 25. There can be another case where the contact section has curving segments BEL3 and BML3, as shown in FIG. 26.

Also, in these cases, it is possible to prevent the occurrence of abnormal etching based on the provision of a jut region Pb on the side BEL5 of the base electrode 8. This jut region has its width LbFb set to be larger than the height of the base mesa 4a plus 0.3 μm, for example.

Accordingly, the present invention does not exclude its application to the pattern shapes shown in FIG. 24 and FIG. 25, but is applicable extensively to the cases Where the base electrode extends toward the area where the side of the base electrode which confronts the emitter mesa intersects the side of the base mesa.

Embodiment 4

A fourth embodiment of this invention will be explained, using as an example an amplifier having a need for high-performance HBTs.

Figure 27:
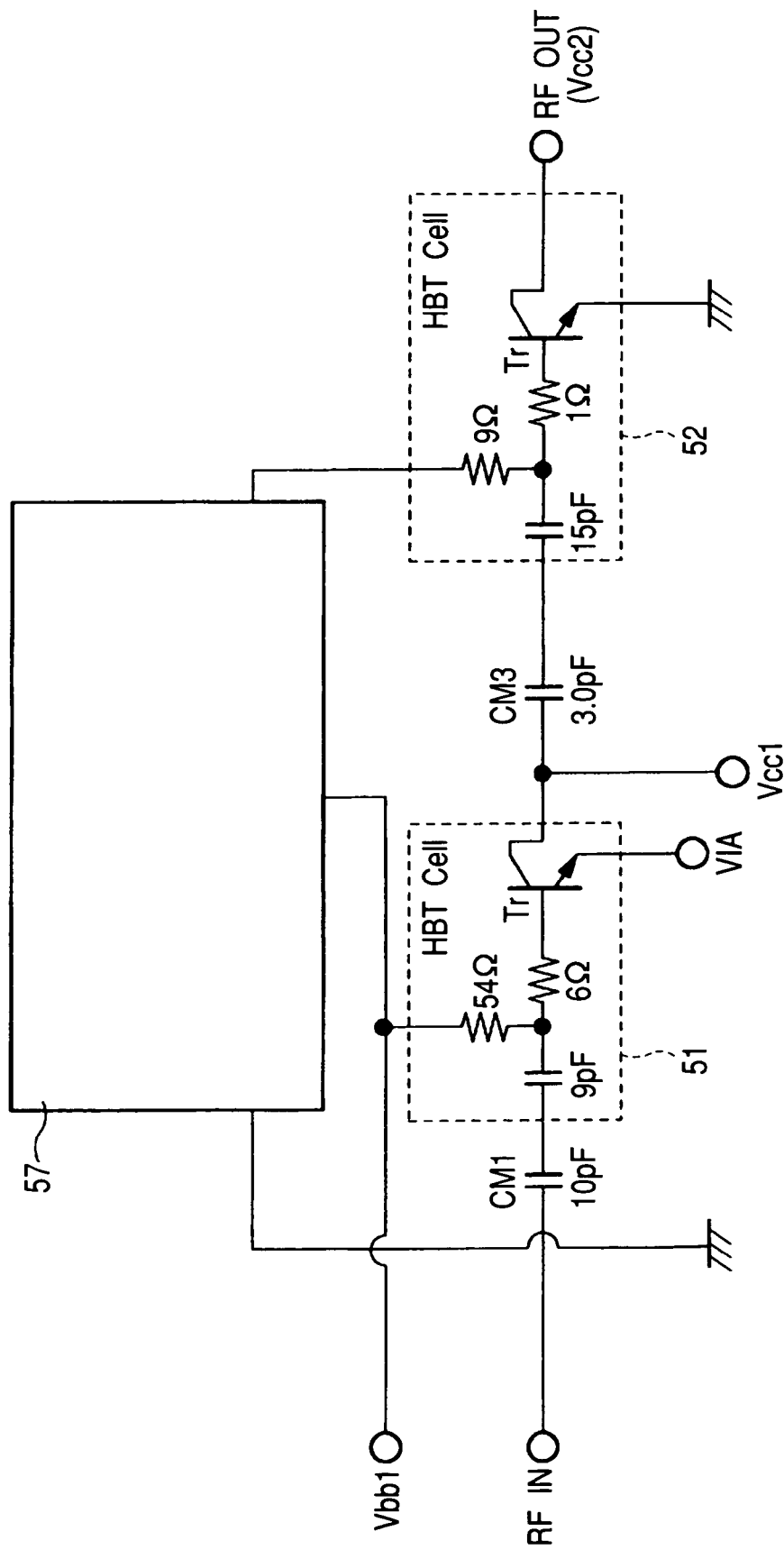
FIG. 27 is a schematic circuit diagram showing an example of the amplifier which uses the inventive semiconductor device (HBT).

FIG. 27 is a circuit diagram showing an example of an amplifier which uses bipolar transistors Tr. The amplifier includes two amplifying circuits (HBT Cells) 51 and 52 connected in series between the input terminal (RF-IN) and the output terminal (RF-OUT). Each amplifying circuit consists of a capacitor, resistors and a bipolar transistor (HBT) Tr. A capacitor CM1 is connected between the input terminal (RF-IN) and the amplifying circuit 51. Another capacitor CM3 is connected between the amplifying circuits 51 and 52. The amplifier is supplied with a power voltage Vcc and base bias voltage Vbb.

This amplifier has operation frequencies of 0.8 GHz or higher, and the bipolar transistors need to have enhanced characteristics to deal with this high signal frequency.

The HBTs of the foregoing first and second embodiment are used suitably for the bipolar transistors shown in FIG. 27. Specifically, based on the reduction of the base-collector capacitance of the bipolar transistors, the amplifier can have an enhanced current appending efficiency and current gain.

While the present invention has been described in connection with specific embodiments, the invention is not confined to these embodiments, but various alterations are obviously possible without departing from the essence of the invention.

Although the embodiments have been explained for npn-type bipolar transistors, the present invention is also applicable to pnp-type bipolar transistors. Although the bipolar transistors of the embodiments are formed on GaAs substrate, another compound semiconductor may be used. Although the foregoing embodiments use a GaAs substrate on which the emitter semiconductor layer of InGaP is formed, the emitter semiconductor layer may be of AlGaAs (aluminum-gallium-arsenic). Alternatively, a substrate of InP (indium-phosphor) may be used, with a base layer of InGaAs and an emitter layer of InP or InAlAs being formed thereon. It is also possible for the present invention to be applied to bipolar transistors based on the use of Si and SiGe, e.g., having a base layer of SiGe and an emitter layer of Si.

Among the features of the present invention disclosed in this specification, the major effectiveness is summarized as follows.

It is possible to improve the characteristics of bipolar transistors.

What is claimed is:

1. A bipolar transistor including a collector, a base and an emitter, said transistor comprising:

(a) a base mesa constituting said base and formed over said collector;
(b) an emitter mesa constituting said emitter and formed over said base mesa; and
(c) a base electrode formed over said base mesa and extending in a first direction,
(d) said base mesa including a jut region in the direction of extension of said base electrode,
wherein said base electrode has a first side which confronts a second side of said emitter mesa, and
wherein a distance between said first side, at its end immediate to said jut region, and the edge of said jut region is larger than or equal to the height of said base mesa plus 0.3 μm.

2. A bipolar transistor including a collector, a base and an emitter, said transistor comprising:

(a) a base mesa constituting said base and formed over said collector, wherein said base mesa has a first through fourth base mesa sides, and extends in the directions in which the first and the third base mesa sides meet, the third and the second base mesa sides meet, the second and the fourth base mesa sides meet, and the fourth and the first base mesa sides meet;
(b) an emitter mesa constituting said emitter and formed over said base mesa, wherein said emitter mesa has a first through fourth emitter mesa sides, and extends in the directions in which the first and the third emitter mesa sides meet, the third and the second emitter mesa sides meet, the second and the fourth emitter mesa sides meet, and the fourth and the first emitter mesa sides meet; and
(c) a base electrode formed over said base mesa to have a first through fourth base electrode sides, and extending in the directions in which the first and the third base electrode sides meet, the third and the second base electrode sides meet, the second and the fourth base electrode sides meet, and the fourth and the first base electrode sides meet,
(d1) the second emitter mesa side confronting the first base electrode side,
(d2) the second base mesa side running along the second base electrode side,
(d3) the fourth base mesa side extending in the direction to meet the second emitter mesa side, first base electrode side, second base mesa side and second base electrode side, and
(d4) a second distance between the first base electrode side, at its end immediate to the fourth base mesa side, and the fourth base mesa side being larger than a first distance between the second base mesa side and the second base electrode side.

3. A bipolar transistor including a collector, a base and an emitter, said transistor comprising:

(a) a base mesa constituting said base and formed in a first region over said collector and in a jut region which is made contiguously to the first region,
said first region having a first through fourth sides and extending in the directions in which the first and the third sides meet, the third and the second sides meet, the second and the fourth sides meet, and the fourth and the first sides meet;
(b) an emitter mesa constituting said emitter and formed over said base mesa, having a first through fourth emitter mesa sides, and extending in the directions in which the first and the third emitter mesa sides meet, the third and the second emitter mesa sides meet, the second and the fourth emitter mesa sides meet, and the fourth and the first emitter mesa sides meet; and (c) a base electrode formed over said base mesa to have a first through fourth base electrode sides and extending in the directions in which the first and the third base electrode sides meet, the third and the second base electrode sides meet, the second and the fourth base electrode sides meet, and the fourth and the first base electrode sides meet, (d1) the second emitter mesa side confronting the first base electrode side, (d2) the second side running along the second base electrode side, (d3) the fourth side extending in the direction to meet the second emitter mesa side, first base electrode side, second side and second base electrode side, and (d4) said jut region comprised in the first region, in its portion immediate to the fourth side, such that a second distance between the first base electrode side, at its end immediate to the fourth side, or the intersection of the first base electrode side and the fourth side in case these sides intersect, and the edge of said jut region is larger than a first distance between the second base electrode side and the second side.

4. A bipolar transistor according to claim 3, wherein said base mesa and said emitter mesa have generally rectangular shapes.

5. A bipolar transistor according to claim 3, wherein said jut region extends along the fourth side, or said jut region is made only in the area at the end of the first base electrode side.

6. A bipolar transistor according to claim 3, (e) wherein said base electrode has a generally L-shape and has a fifth and sixth base electrode sides, the third base electrode side runs along the third side, and said second distance is larger than a third distance between the third base electrode side and the third side.

7. A bipolar transistor according to claim 3, wherein said second distance is larger than or equal to the height of said base mesa plus 0.3 μm.

8. A bipolar transistor according to claim 3, wherein said first distance is positive when the second side is located outside of the second base electrode side, is zero when the second base electrode side coincides with the second side, or is negative when the second base electrode side is located outside of the second side.

9. A bipolar transistor according to claim 3, wherein said base mesa is formed in the first region, the jut region and other jut region, said other jut region being made in the first region, in its portion immediate to the second side, such that a third distance between the end of the first base electrode side and the edge of the other jut region is larger than the first distance.

10. A bipolar transistor according to claim 9, wherein the third distance is larger than or equal to the height of said base mesa plus 0.3 μm.

11. A bipolar transistor according to claim 3 comprising a bipolar transistor of hetero junction type, said base mesa being formed of gallium-arsenic (GaAs) or indium-phosphor (InP).

12. A bipolar transistor according to claim 3, wherein said base electrode has its lowest layer formed of alloy of platinum (Pt) and compound semiconductor.

13. A bipolar transistor according to claim 11, wherein said hetero-junction bipolar transistor is used for a high-frequency amplifying circuit having operation frequencies of 0.8 GHz or higher.

14. A bipolar transistor according to claim 3 comprising a bipolar transistor of hetero junction type, said base mesa being formed of silicon-germanium (SiGe).

15. A bipolar transistor including a collector, a base and an emitter, said transistor comprising:

(a) a base mesa constituting said base and formed over said collector;

(b) an emitter mesa constituting said emitter and formed over said base mesa and extending in a first direction; and (c) a base electrode formed over said base mesa, (d) said base mesa having a jut region in the direction of extension of said emitter mesa, wherein said base electrode has a first side which confronts a second side of said emitter mesa, and wherein a distance between said first side, at its end immediate to said jut region, and the edge of said jut region is larger than or equal to the height of said base mesa plus 0.3 μm.

* * * * *